US011889775B2

(12) United States Patent
Sangwan et al.

(10) Patent No.: US 11,889,775 B2
(45) Date of Patent: Jan. 30, 2024

(54) MULTI-TERMINAL MEMTRANSISTORS AND APPLICATIONS OF THE SAME

(71) Applicant: NORTHWESTERN UNIVERSITY, Evanston, IL (US)

(72) Inventors: Vinod K. Sangwan, Evanston, IL (US); Hong-Sub Lee, Evanston, IL (US); Mark C. Hersam, Wilmette, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 374 days.

(21) Appl. No.: 16/770,662

(22) PCT Filed: Dec. 17, 2018

(86) PCT No.: PCT/US2018/065929
§ 371 (c)(1),
(2) Date: Jun. 8, 2020

(87) PCT Pub. No.: WO2019/125994
PCT Pub. Date: Jun. 27, 2019

(65) Prior Publication Data
US 2021/0175419 A1    Jun. 10, 2021

Related U.S. Application Data

(60) Provisional application No. 62/599,946, filed on Dec. 18, 2017.

(51) Int. Cl.
*H10N 70/20* (2023.01)
*G11C 13/00* (2006.01)
(Continued)

(52) U.S. Cl.
CPC ....... *H10N 70/253* (2023.02); *G11C 13/0002* (2013.01); *H10B 63/30* (2023.02);
(Continued)

(58) Field of Classification Search
CPC . H01L 27/2436; H01L 45/08; H01L 45/1206; H01L 45/1226; H01L 45/1253;
(Continued)

(56) References Cited

U.S. PATENT DOCUMENTS 5,022,930 A    6/1991  Ackerman et al.
2005/0285096 A1    12/2005  Kozicki
(Continued)

OTHER PUBLICATIONS

Sangwan, V. et al. "Multi-Terminal Memtransistors from Polycrystalline Monolayer Molybdenum Disulfide." Nature, vol. 554, pp. 500-517. Feb. 22, 2018. (Year: 2018).*
(Continued)

*Primary Examiner* — Herve-Louis Y Assouman
*Assistant Examiner* — Christopher M Roland
(74) *Attorney, Agent, or Firm* — Locke Lord LLP; Tim Tingkang Xia, Esq.

(57) ABSTRACT

One aspect of the invention relates to a multi-terminal memtransistor. The memtransistor includes a substrate having a first surface and an opposite, second surface, a polycrystalline monolayer film formed of an atomically thin material on the first surface of the substrate, an electrode array having a plurality of electrodes spatial-apart formed on the polycrystalline monolayer film such that each pair of electrodes defines a channel in the polycrystalline monolayer film therebetween, and a gate electrode formed on the second surface of the substrate and capacitively coupled with the channel. The polycrystalline monolayer film contains grains defining a plurality of grain boundaries thereof. The multi-terminal memtransistor operates much like a neuron by performing both memory and information processing, and can be a foundational circuit element for new forms of neuromorphic computing.

31 Claims, 21 Drawing Sheets

(51) Int. Cl.
| | |
|---|---|
| *H10B 63/00* | (2023.01) |
| *H10N 70/00* | (2023.01) |
| *G06N 3/049* | (2023.01) |
| *G06N 3/088* | (2023.01) |
| *G06N 3/065* | (2023.01) |

(52) U.S. Cl.
CPC ........... *H10N 70/023* (2023.02); *H10N 70/24* (2023.02); *H10N 70/823* (2023.02); *H10N 70/841* (2023.02); *H10N 70/8822* (2023.02); *H10N 70/8825* (2023.02); *G06N 3/049* (2013.01); *G06N 3/065* (2023.01); *G06N 3/088* (2013.01)

(58) Field of Classification Search
CPC ..... H01L 45/142; H01L 45/143; H10B 63/30; H10N 70/253; H10N 70/823; H10N 70/841; H10N 70/8822; H10N 70/8825
See application file for complete search history.

(56) References Cited

U.S. PATENT DOCUMENTS

| | | | |
|---|---|---|---|
| 2013/0026434 A1 | 1/2013 | Yang et al. | |
| 2014/0346423 A1 | 11/2014 | Driscoll et al. | |
| 2014/0353166 A1* | 12/2014 | Iezzi | B01J 35/004 502/220 |
| 2015/0170906 A1* | 6/2015 | Redepenning | H01L 29/66045 257/29 |
| 2016/0248007 A1 | 8/2016 | Hersam et al. | |
| 2016/0308006 A1* | 10/2016 | Park | H01L 29/24 |

OTHER PUBLICATIONS

Korean Intellectual Property Office (ISR/KR), "International Search Report for PCT/US2018/065929", Korea, dated Apr. 1, 2019.
Strukov, D.B., Snider, G.S., Stewart, D.R. & Williams, R.S. The missing memristor found. Nature453, 80-83 (2008).
Yang, J.J. et al. Memristive switching mechanism for metal/oxide/metal nanodevices. Nat. Nanotechnol.3, 429-433 (2008).
Duygu, K., Shimeng, Y. & Wong, H.S.P. Synaptic electronics: materials, devices and applications. Nanotechnology24, 382001 (2013).
Yu, S. & Chen, P.Y. Emerging memory technologies: Recent trends and prospects. IEEE Sol. Stat. Circuit Mag.8, 43-56 (2016).
Yang, J.J., Strukov, D.B. & Stewart, D.R. Memristive devices for computing. Nat. Nanotechnol.8, 13-24 (2013).
Waser, R., Dittmann, R., Staikov, G. & Szot, K. Redox-based resistive switching memories—Nanoionic mechanisms, prospects, and challenges. Adv. Mater.21, 2632-2663 (2009).
Pershin, Y.V. & Di Ventra, M. Memory effects in complex materials and nanoscale systems. Adv. Phys.60, 145-227 (2011).
Wong, H.S.P., et al. Metal-oxide RRAM. Proc. IEEE100, 1951-1970 (2012).
Andy, T. Memristor-based neural networks. J. Phys. D: Appl. Phys.46, 093001 (2013).
Giacomo, I. et al. Integration of nanoscale memristor synapses in neuromorphic computing architectures. Nanotechnology24, 384010 (2013).
Jo, S.H. et al. Nanoscale memristor device as synapse in neuromorphic systems. Nano Lett.10, 1297-1301 (2010).
Kim, S. et al. Pattern recognition using carbon nanotube synaptic transistors with an adjustable weight update protocol. ACS Nano11, 2814-2822 (2017).
Kim, S. et al. Experimental demonstration of a second-order memristor and its ability to biorealistically implement synaptic plasticity. Nano Lett.15, 2203-2211 (2015).
Widrow, B. An adaptive adaline neuron using chemical memistors. Stanford Electronics Laboratories Technical Report1553-2 (1960).
Lai, Q. et al. Ionic/electronic hybrid materials integrated in a synaptic transistor with signal processing and learning functions. Adv. Mater.22, 2448-2453 (2010).
Diorio, C., Hasler, P., Minch, A. & Mead, C.A. A single-transistor silicon synapse. IEEE Trans. Electron Dev.43, 1972-1980 (1996).
Mouttet, B. Memristive systems analysis of 3-terminal devices. IEEE Inter. Conf. Electron, Circuits & Systems 930-933 (2010).
Azizi, A. et al. Dislocation motion and grain boundary migration in two-dimensional tungsten disulphide. Nat. Commun.5, 4867 (2014).
Komsa, H.-P. et al. From point to extended defects in two-dimensional MoS2: Evolution of atomic stmcture under electron irradiation. Phys. Rev. B88, 035301 (2013).
Sangwan, V.K. et al. Gale-tunable memristive phenomena mediated by grain boundaries in single-layer MoS2. Nat. Nanotechnol.10, 403-406 (2015).
Yu, Z.G., Zhang, Y.-W. & Yakobson, B.I. An anomalous formation pathway for dislocation-sulfur vacancy complexes in polycrystalline monolayer MoS2. Nano Lett.15, 6855-6861 (2015).
Bessonov, A.A. et al. Layered memristive and memcapacitive switches for printable electronics. Nat. Mater.14, 199-204 (2015).
He, G. et al. Thermally assisted nonvolatile memory in monolayer MoS2 transistors. Nano Lett. 16, 6445-6451 (2016).
Arnold, A.J. et al. Mimicking neurotransmitter release in chemical synapses via hysteresis engineering in MoS2 transistors. ACS Nano11, 3110-3118 (2017).
Chua, L. Resistance switching memories are memristors. Appl. Phys. A102, 765-783 (2011).
Shannon, J.M. Control of Schottky barrier height using highly doped surface layers. Sol. Stat. Electron.19, 537-543 (1976).
Sze, S.M. & Ng, K.K. Physics of Semiconductor Devices. Wiley-Interscience, 2006.
Prodromakis, T., Peh, B.P., Papavassiliou, C. & Toumazou, C. A versatile memristor model with nonlinear dopant kinetics. IEEE Trans. Electron Dev.58, 3099-3105 (2011).
Lembke, D. & Kis, A. Breakdown of high-performance monolayer MoS2 transistors. ACS Nano6, 10070-10075 (2012).
Yang, Y., Chen, B. & Lu, W.D. Memristive physically evolving networks enabling the emulation of heterosynaptic plasticity. Adv. Mater.27, 7720-7727 (2015).
Wang, I.T. et al. 3D Ta/TaOx/TiO2/Ti synaptic array and linearity tuning of weight update for hardware neural network applications. Nanotechnology27, 365204 (2016).
Bi, G.-Q. & Poo, M.-M. Synaptic modifications in cultured hippocampal neurons: Dependence on spike timing, synaptic strength, and postsynaptic cell type. J. Neurosci. 18, 10464-10472 (1998).
Shastry, T.A. et al. Mutual photoluminescence quenching and photovoltaic effect in large-area single-layer MoS2-polymer heterojunctions. ACS Nano10, 10573-10579 (2016).
Liu, X. et al. Rotationally commensurate growth of MoS2 on epitaxial graphene. ACS Nano10, 1067-1075 (2016).
Lee, C. et al. Anomalous lattice vibrations of single- and few-layer MoS2. ACS Nano4, 2695-2700 (2010).
Kim, I.S. et al. Influence of stoichiometry on the optical and electrical properties of chemical vapor deposition derived MoS2. ACS Nano8, 10551-10558 (2014).
Chen, J.-R. et al. Control of Schottky barriers in single layer MoS2 transistors with ferromagnetic contacts. Nano Lett.13, 3106-3110 (2013).
Chua, L. Memristor-the missing circuit element. IEEE Transactions on Circuit Theory18, 507-519 (1971).
Chua, L.O. & Sung Mo, K. Memristive devices and systems. Proc. IEEE64, 209-223 (1976).
Shannon, J.M. Reducing the effective height of a Schottky barrier using low-energy ion implantation. Appl. Phys. Lett.24, 369-371 (1974).
Shannon, J.M. Increasing the effective height of a Schottky barrier using low-energy ion implantation. Appl. Phys. Lett.25, 75-77 (1974).
Kedzierski, J., et al. Complementary silicide source/drain thin-body MOSFETs for the 20 nm gate length regime. International Electron Devices Meeting 2000. Technical Digest. IEDM (Cat. No. 00CH37138) 57-60 (2000).

(56) References Cited

OTHER PUBLICATIONS

Calvet, L.E. Electrical transport in Schottky barrier MOSFETs. PhD thesis, Yale, 2001.
Sawa, A. Resistive switching in transition metal oxides. Mater. Today 11, 28-36 (2008).
Kubicek, M., Schmitt, R., Messerschmitt, F. & Rupp, J.L.M. Uncovering two competing switching mechanisms for epitaxial and ultrathin strontium titanate-based resistive switching bits. ACS Nano 9, 10737-10748 (2015).
Lee, H.-S. et al. Ferroelectric tunnel junction for dense cross-point arrays. ACS Appl. Mater. Interfaces 7, 22348-22354 (2015).
Kim, D.J. et al. Ferroelectric tunnel memristor. Nano Lett. 12, 5697-5702 (2012).
Nakamura, M. et al. Interface band profiles of Mott-insulator/Nb:SrTiO3 heterojunctions as investigated by optical spectroscopy. Phys. Rev. B 82, 201101 (2010).
Sawa, A., Fujii, T., Kawasaki, M. & Tokura, Y. Hysteretic current-voltage characteristics and resistance switching at a rectifying Ti/Pr0.7Ca0.3MnO3 interface. Appl. Phys. Lett. 85, 4073-4075 (2004).
Liu, W. et al. Impact of contact on the operation and performance of back-gated monolayer MoS2 field-effect-transistors. ACS Nano 9, 7904-7912 (2015).
Dankert, A., Langouche, L., Kamalakar, M.V. & Dash, S.P. High-performance molybdenum disulfide field-effect transistors with spin tunnel contacts. ACS Nano 8, 476-482 (2014).
Lee, S., Tang, A., Aloni, S. & Wong, H.S.P. Statistical study on the Schottky barrier reduction of tunneling contacts to CVD synthesized MoS2. Nano Lett. 16, 276-281 (2016).
Wang, J. et al. High mobility MoS2 transistor with low Schottky barrier contact by using atomic thick h-BN as a tunneling layer. Adv. Mater. 28, 8302-8308 (2016).

\* cited by examiner

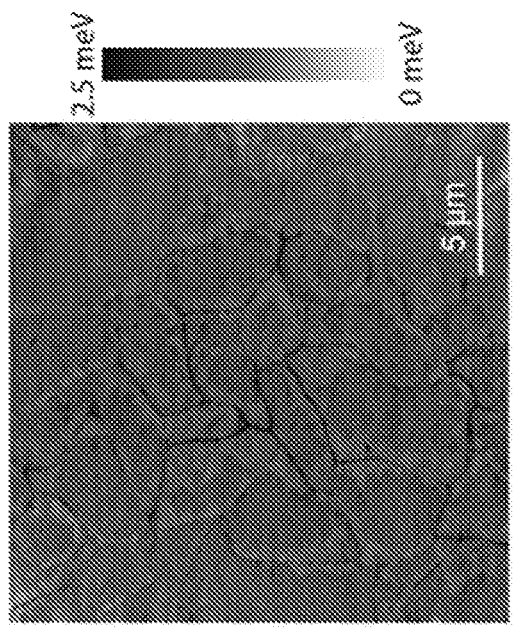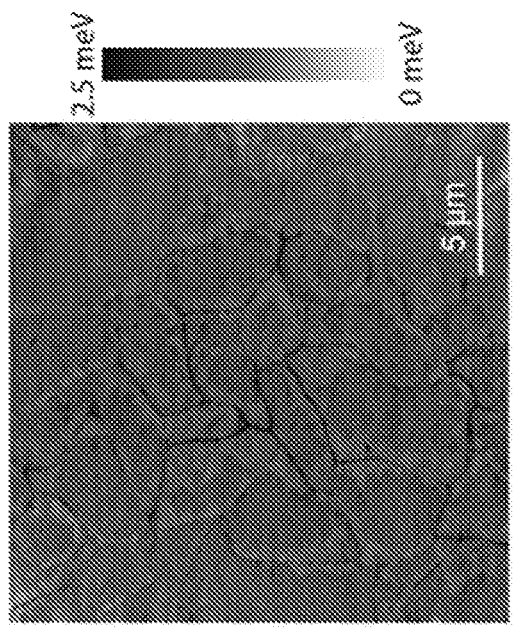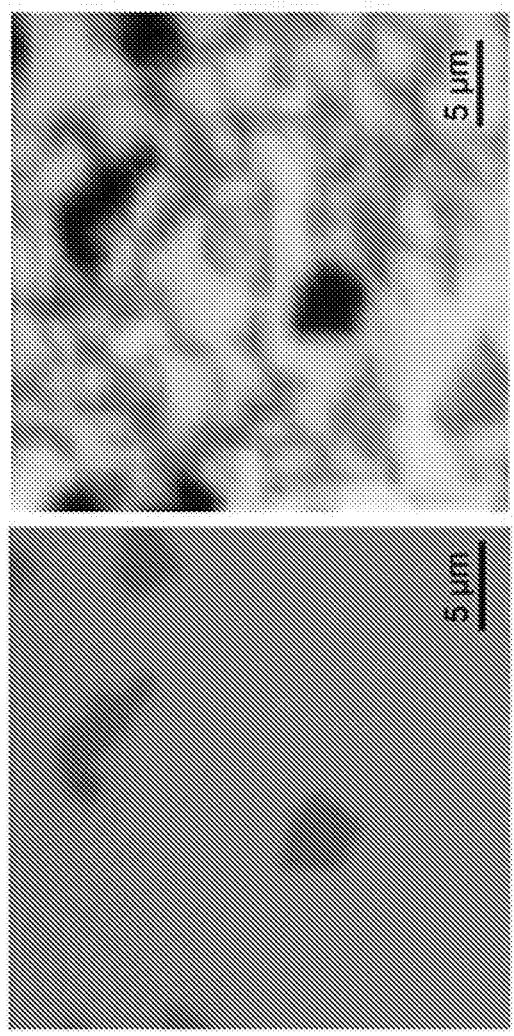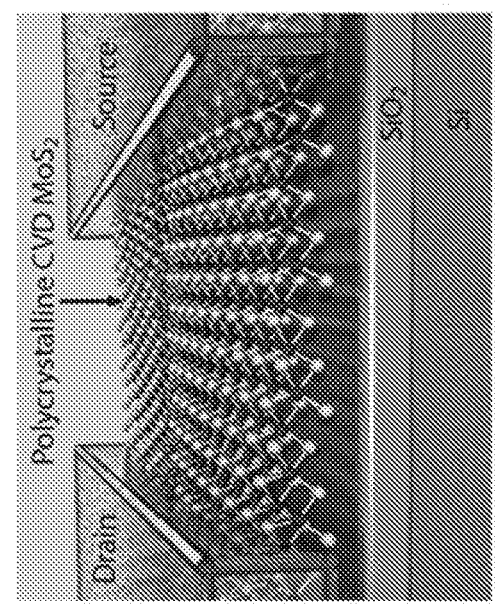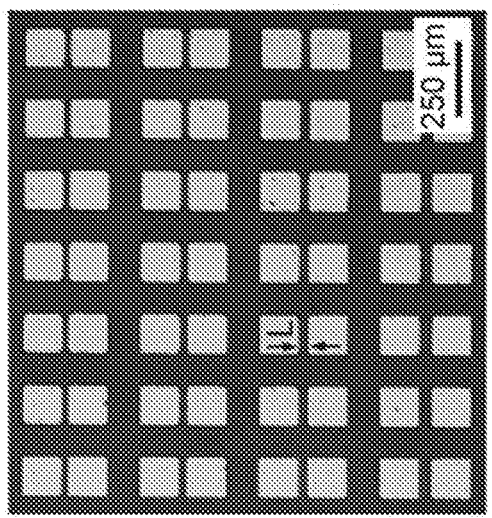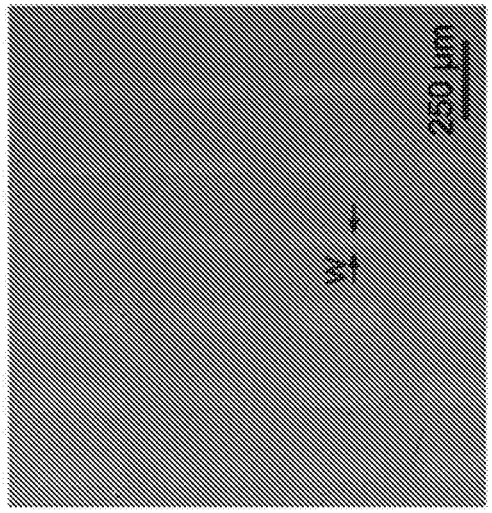
FIG. 1A  FIG. 1B  FIG. 1C
FIG. 1D  FIG. 1E  FIG. 1F

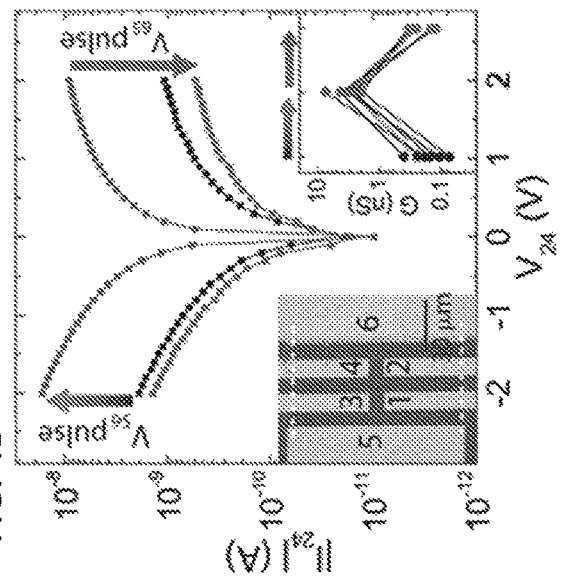
FIG. 4A
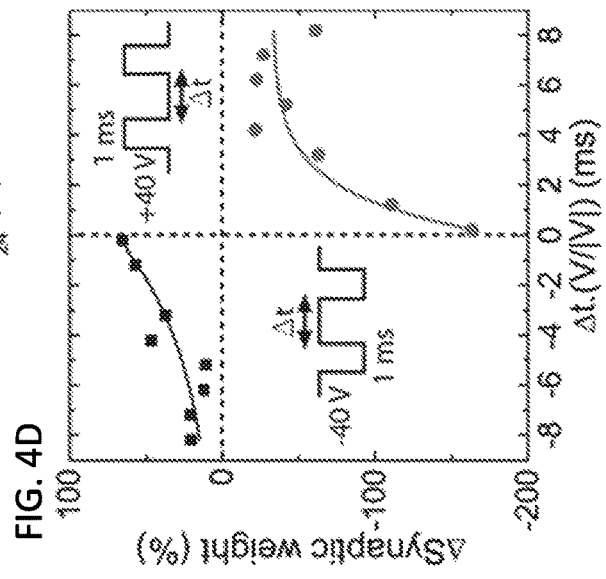
FIG. 4B
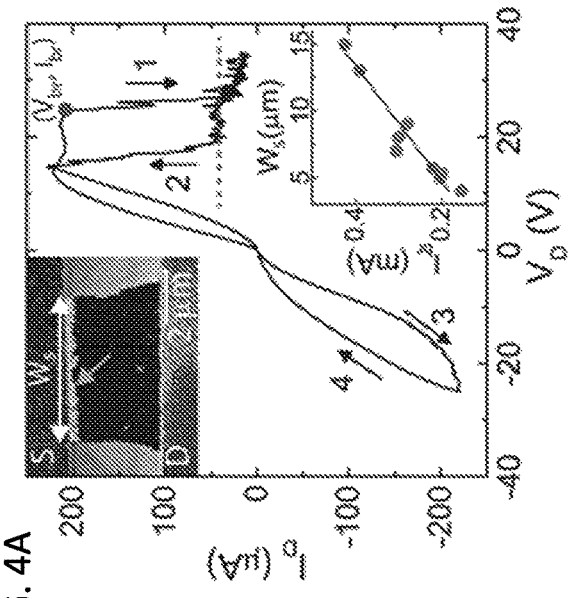
FIG. 4C
FIG. 4D

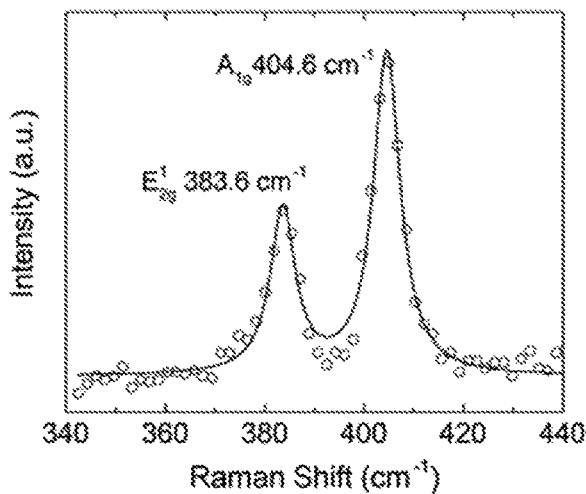
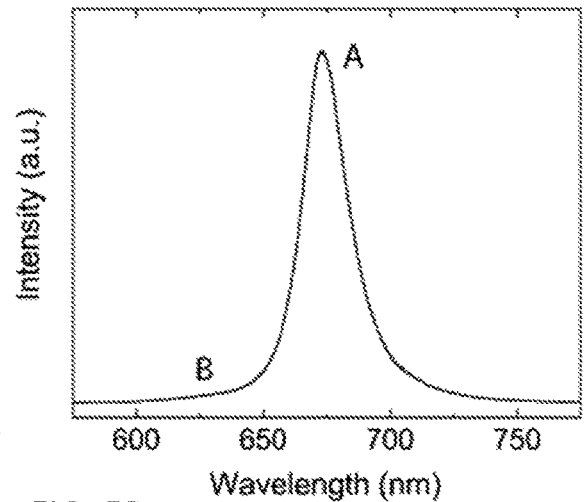
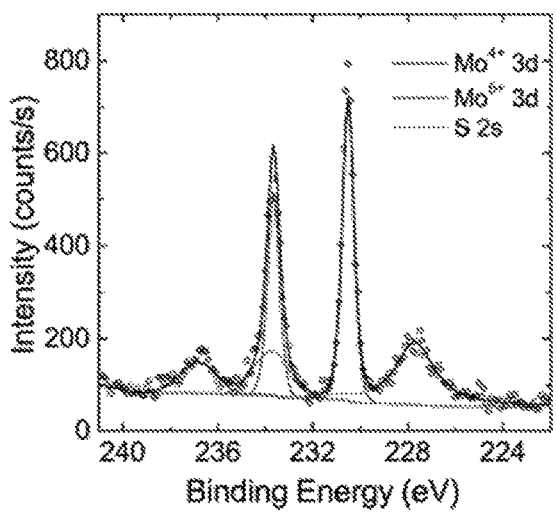
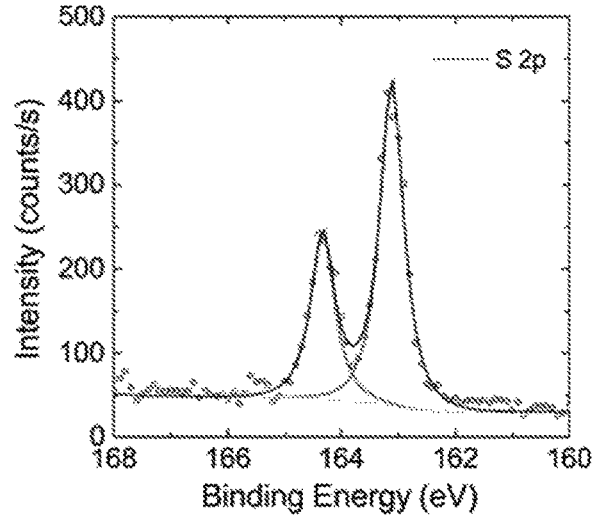
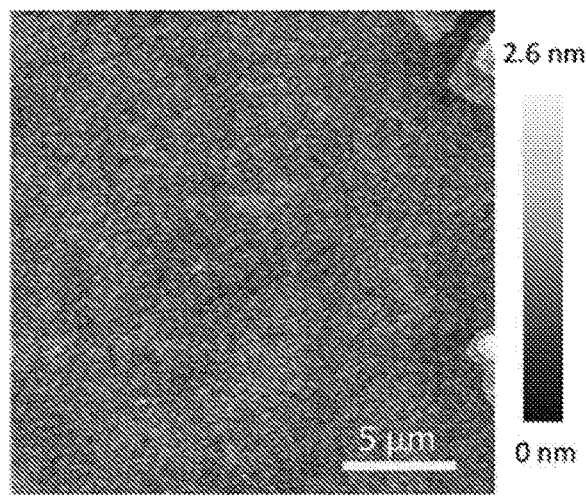
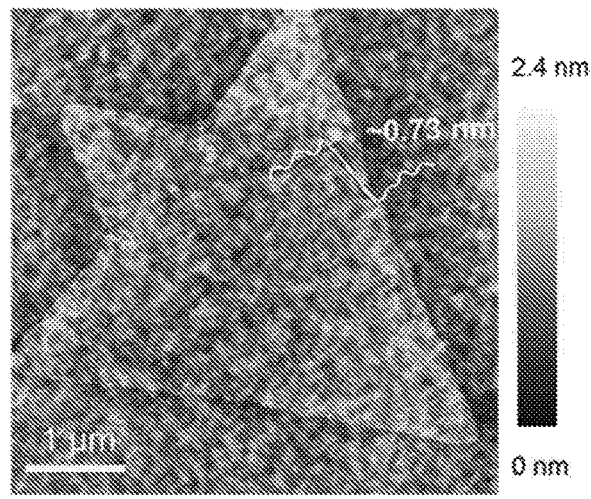

FIG. 7A
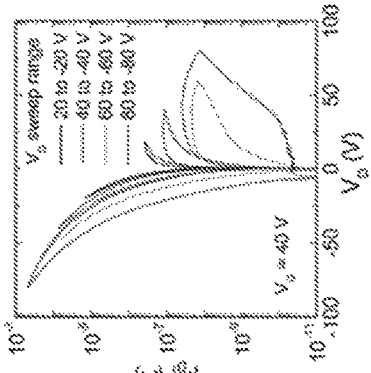
FIG. 7B
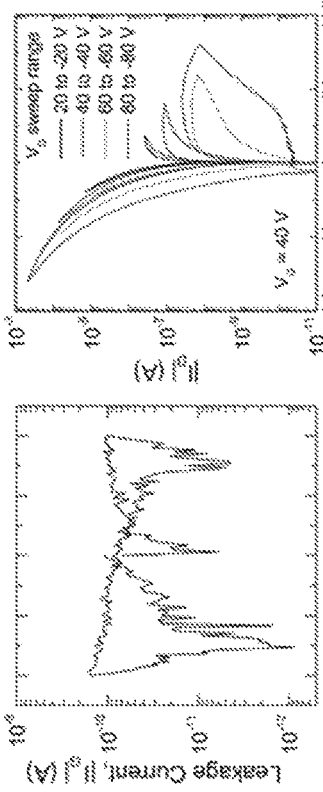
FIG. 7C
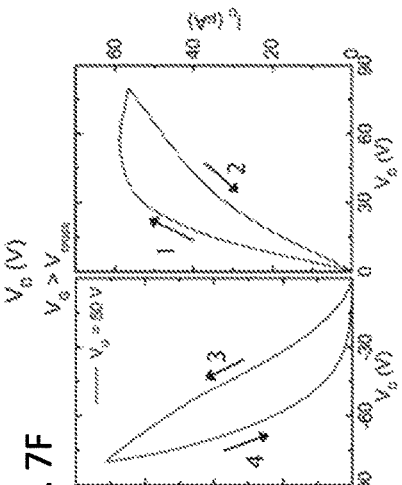
FIG. 7D
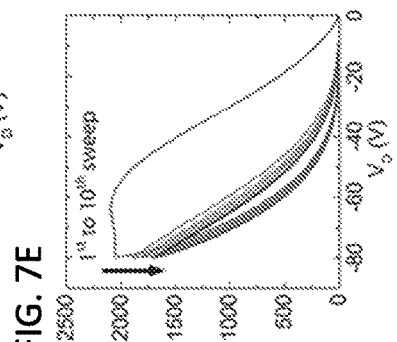
FIG. 7E
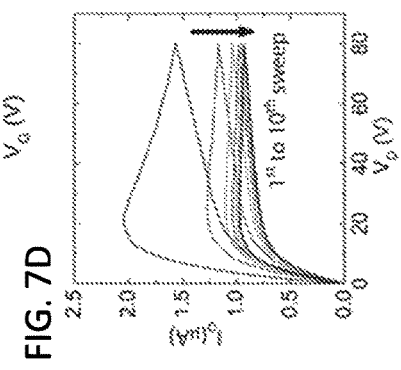
FIG. 7F
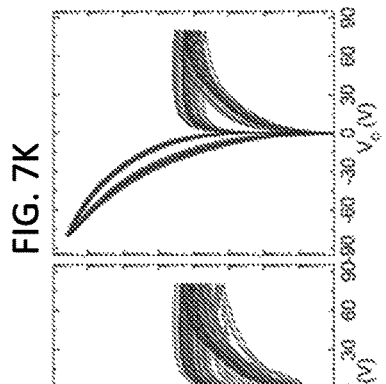
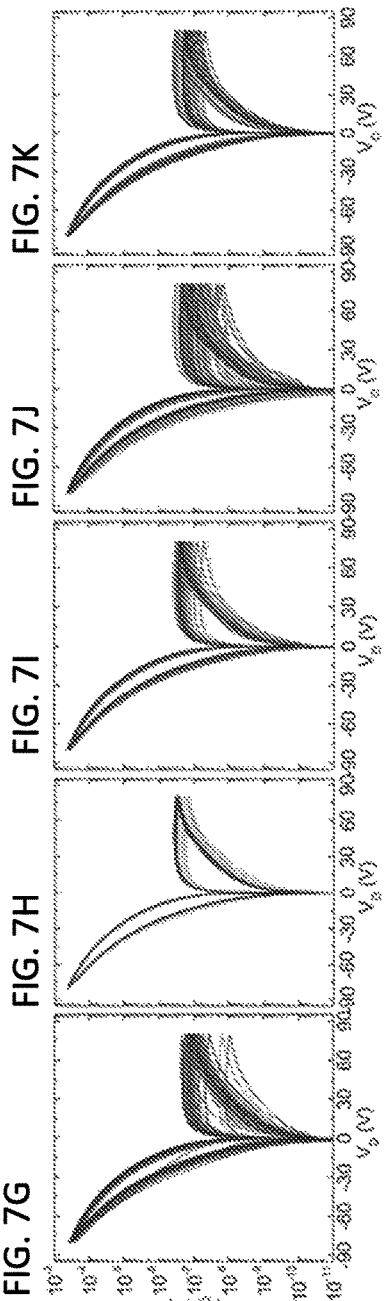
FIG. 7G FIG. 7H FIG. 7I FIG. 7J FIG. 7K

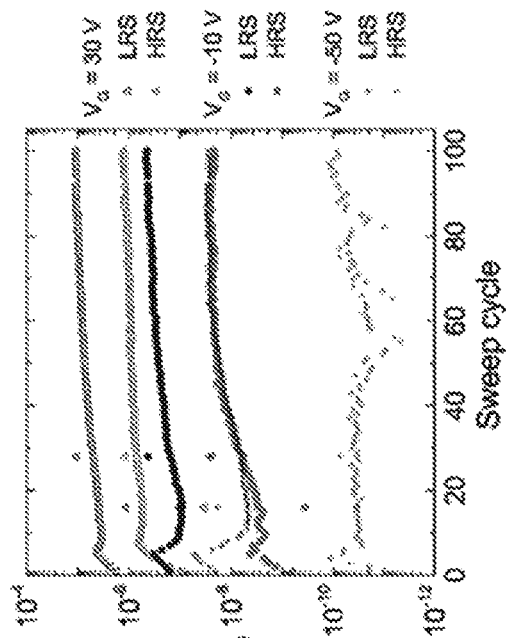
FIG. 8A
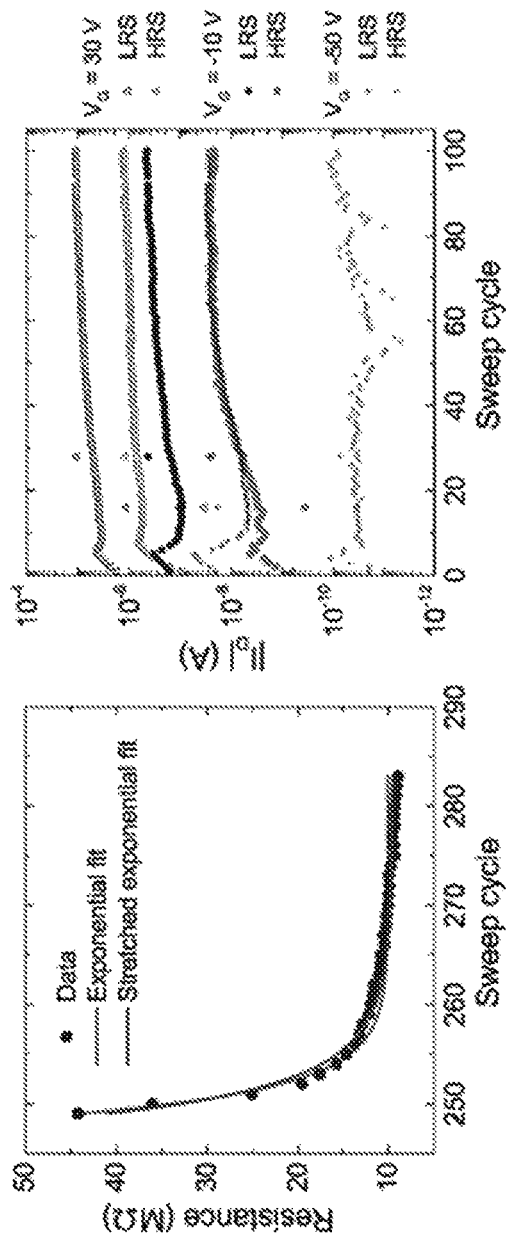
FIG. 8B
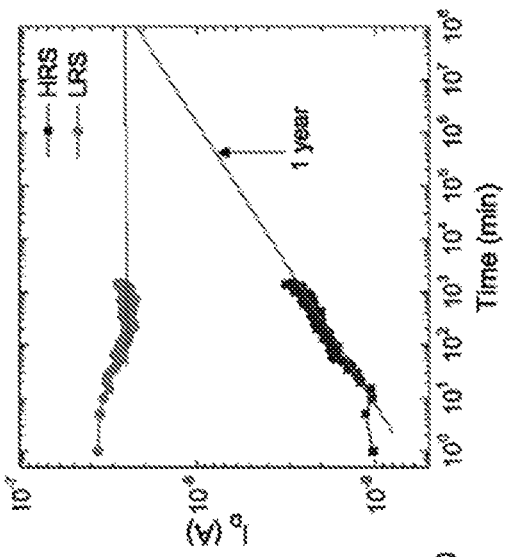
FIG. 8E
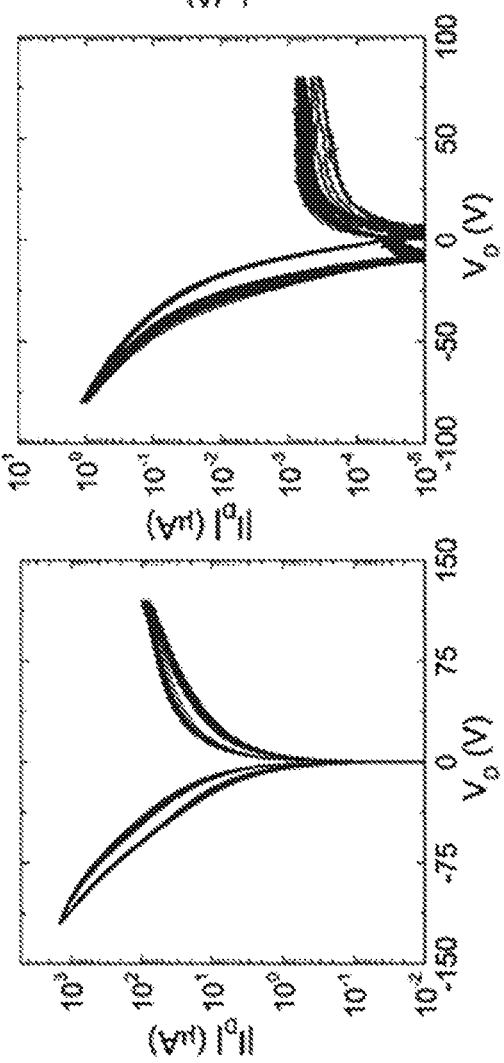
FIG. 8C
FIG. 8D

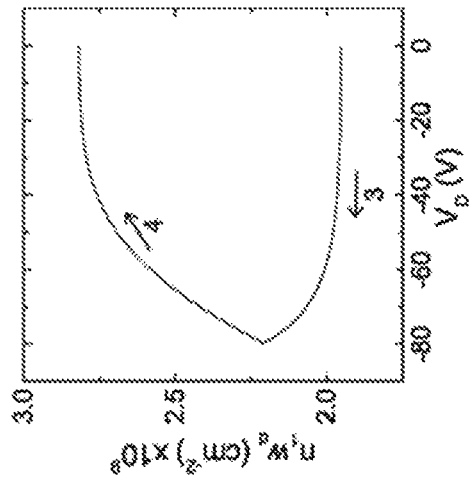
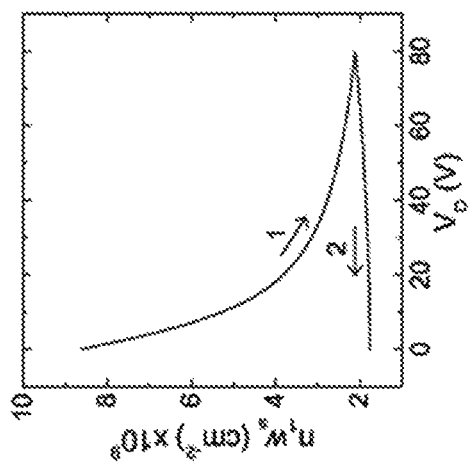
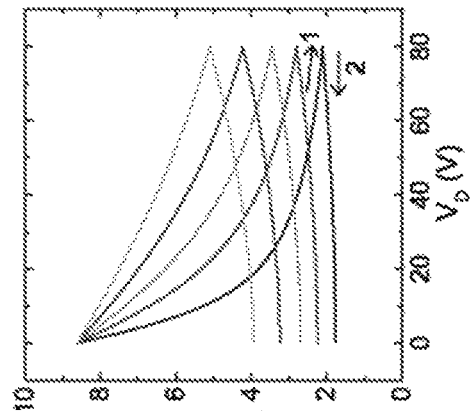
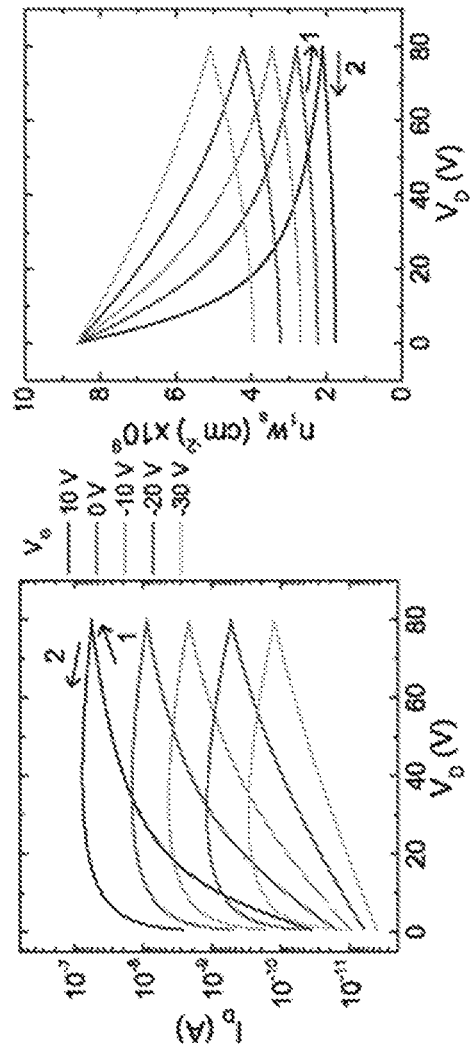
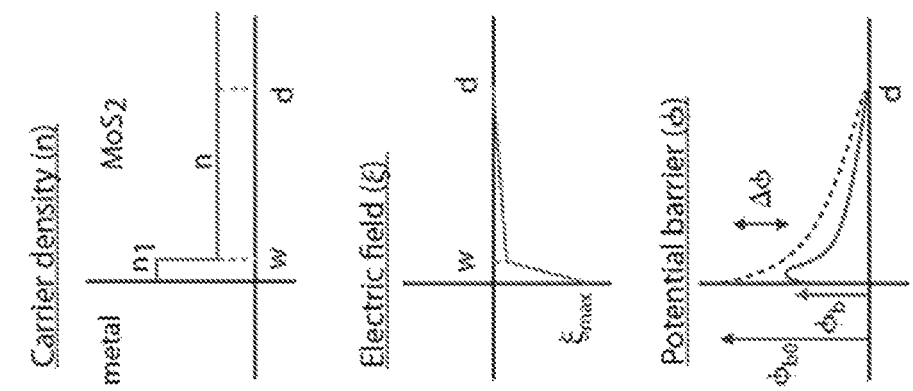
FIG. 11C
FIG. 11B
FIG. 11A
FIG. 11E
FIG. 11D

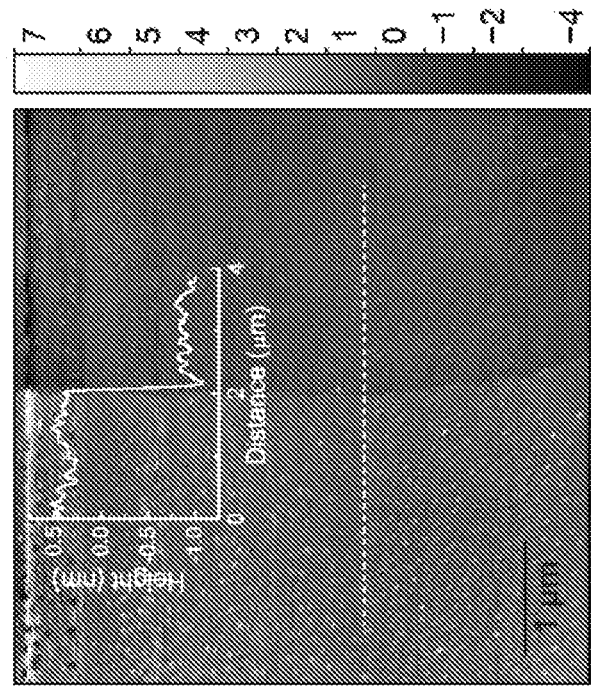
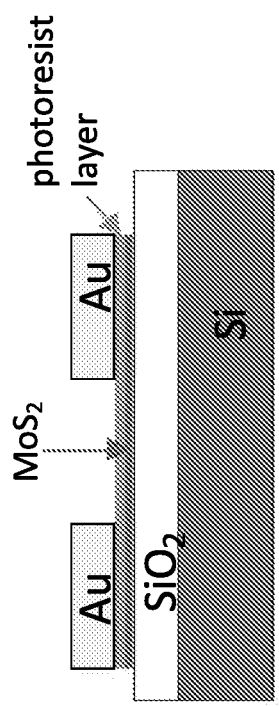
FIG. 12A
FIG. 12B

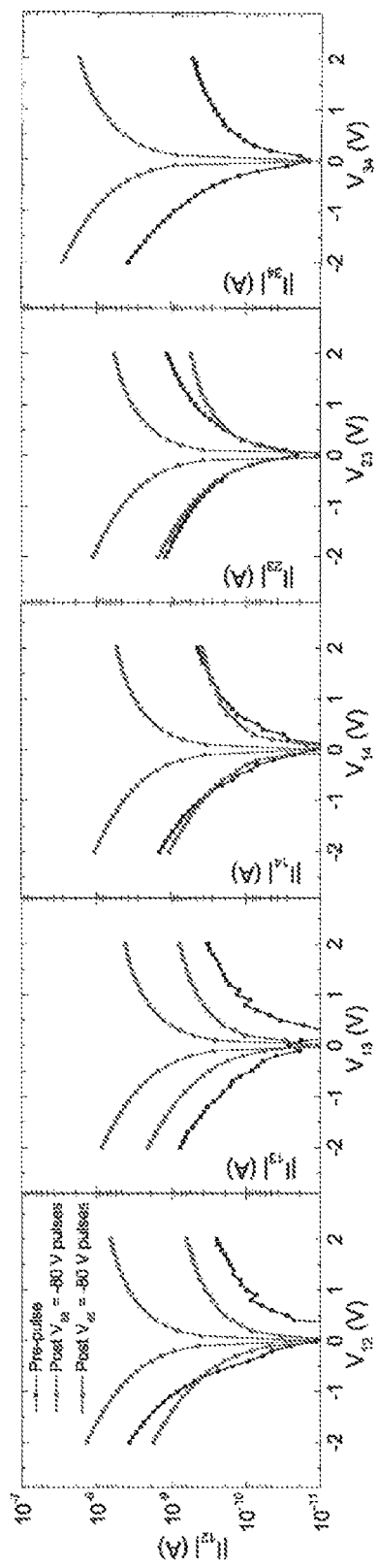
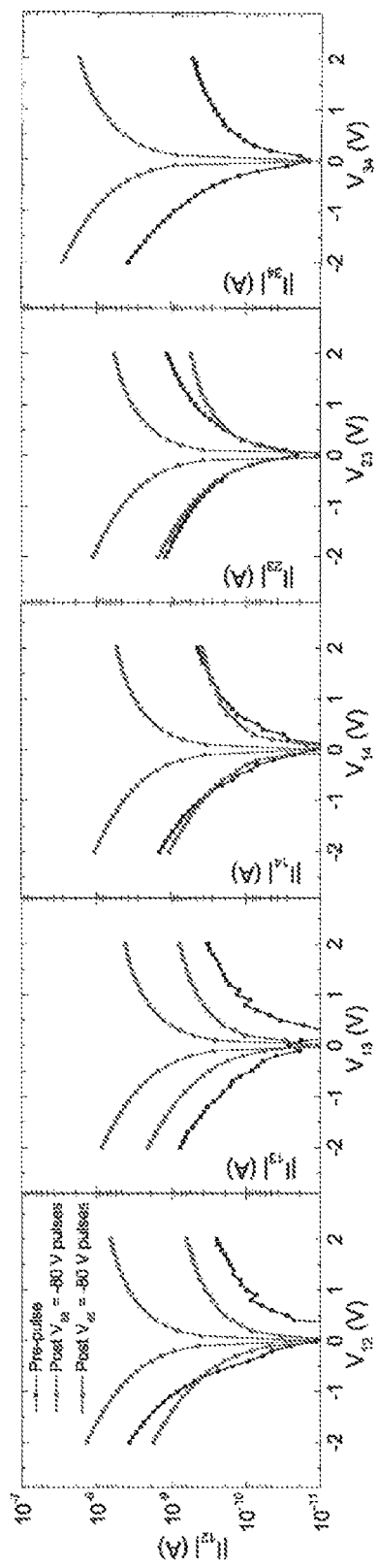
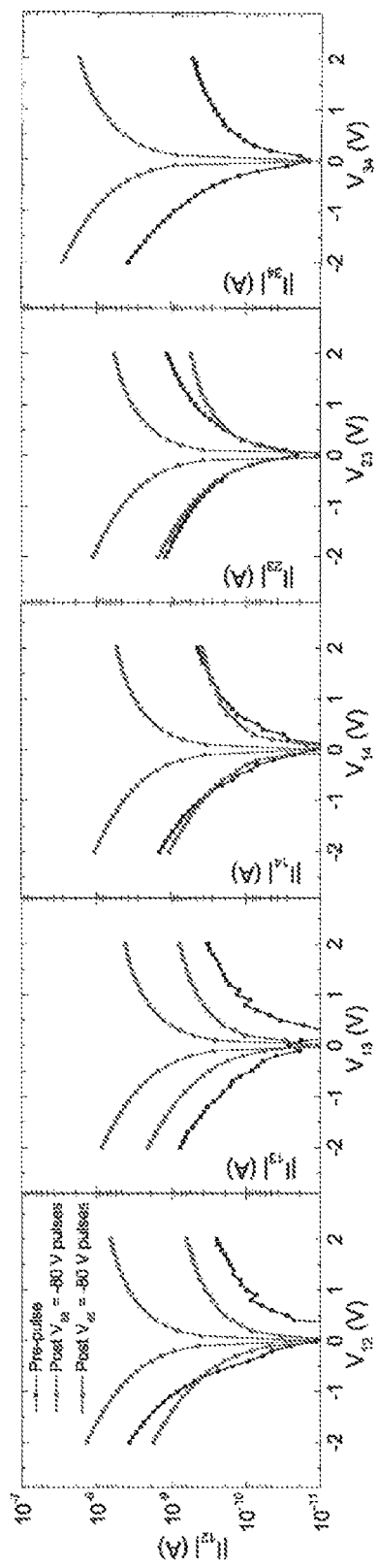
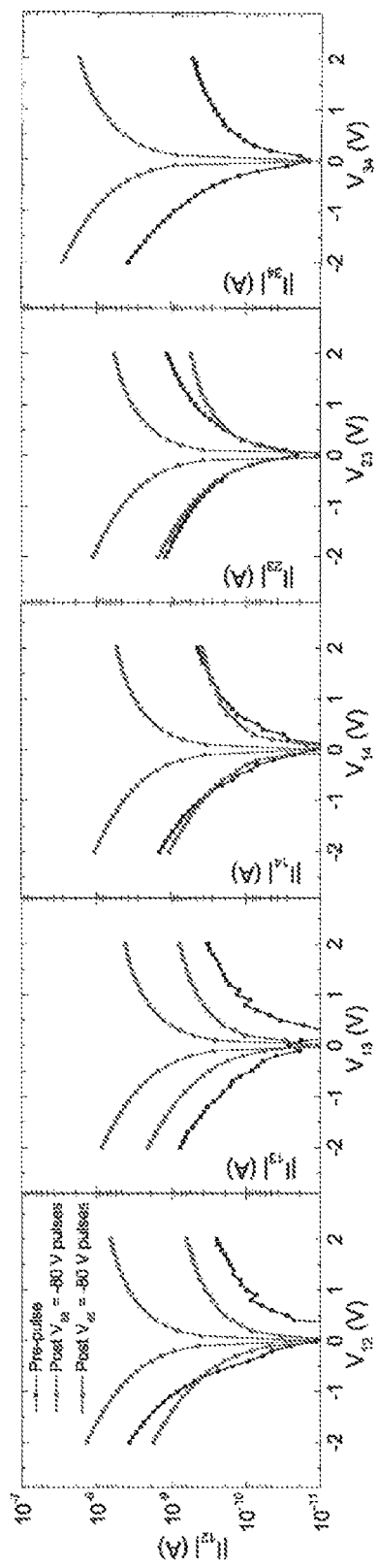
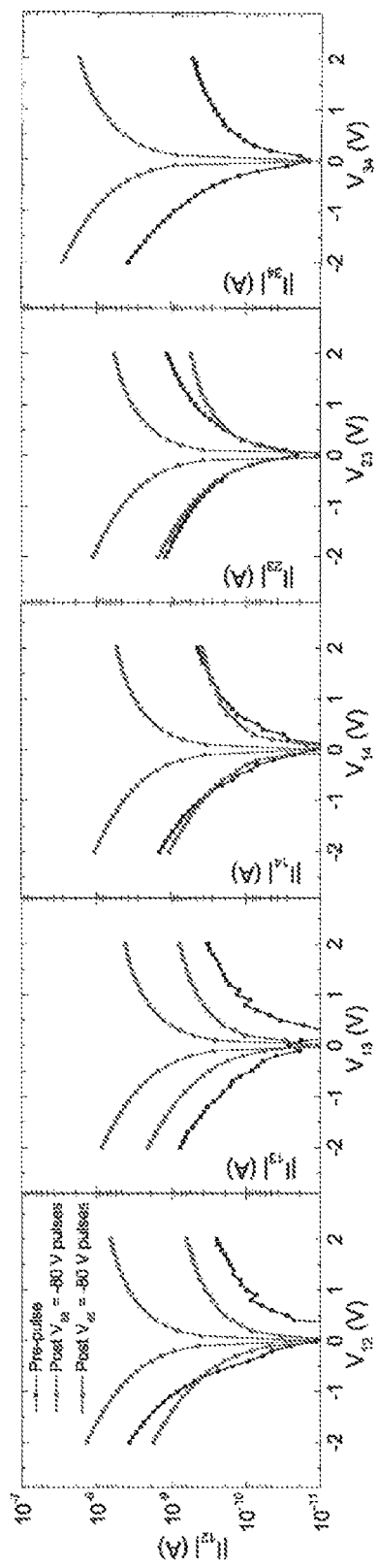
FIG. 14A  FIG. 14B  FIG. 14C  FIG. 14D  FIG. 14E
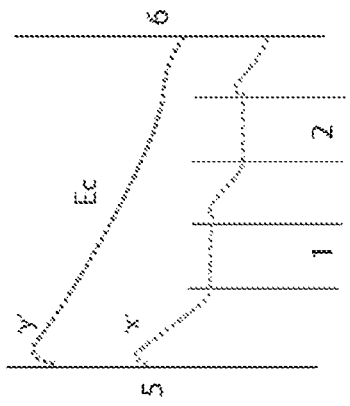
FIG. 14H
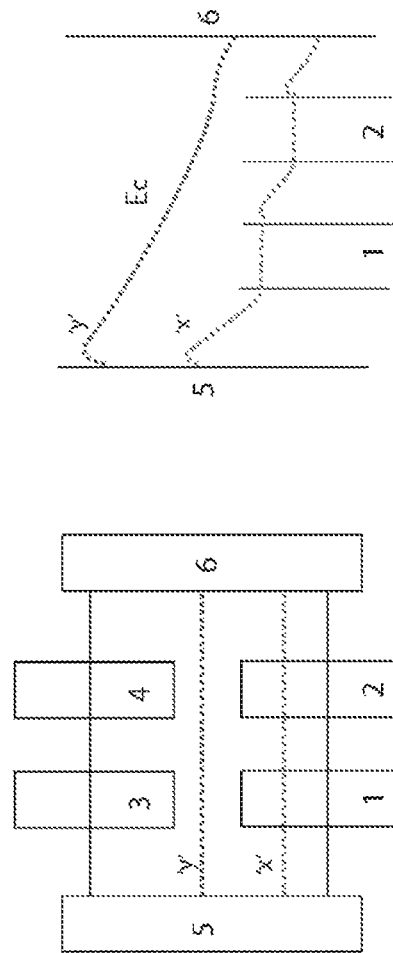
FIG. 14G
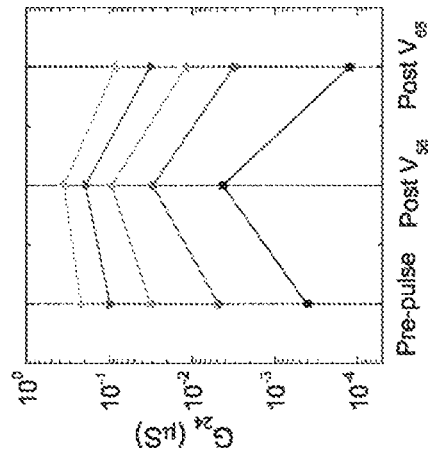
FIG. 14F

MULTI-TERMINAL MEMTRANSISTORS AND APPLICATIONS OF THE SAME

CROSS-REFERENCE TO RELATED PATENT APPLICATION

This application claims priority to and the benefit of U.S. provisional patent application Ser. No. 62/599,946, filed Dec. 18, 2017, entitled "MULTI-TERMINAL MEMTRANSISTORS, FABRICATING METHODS AND APPLICATIONS OF SAME," by Vinod K. Sangwan, Hong-Sub Lee and Mark C. Hersam, which is incorporated herein in its entirety by reference.

STATEMENT AS TO RIGHTS UNDER FEDERALLY-SPONSORED RESEARCH

This invention was made with government support under DMR-1720139 and EFRI-1433510 awarded by the National Science Foundation, and under 70NANB14H012 awarded by the National Institute of Standards and Technology. The government has certain rights in the invention.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [20] represents the 20th reference cited in the reference list, namely, Sangwan, V. K. et al. Gate-tunable memristive phenomena mediated by grain boundaries in single-layer $MoS_2$. Nat. Nanotechnol. 10, 403-406 (2015).

FIELD OF THE INVENTION

The present invention relates generally to the field of neuromorphic computing, and more particularly to multi-terminal memtransistors using a polycrystalline monolayer film of an atomically thin material containing grains defining a plurality of grain boundaries thereof, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

In the last decade, a 2-terminal passive circuit element called a memristor has been developed for non-volatile resistive random access memory and has more recently shown promise for neuromorphic computing [1-6]. Compared to flash memory, memristors have higher endurance, multi-bit data storage, and faster read/write times [4, 7, 8]. However, although 2-terminal memristors have demonstrated basic neural functions, synapses in the human brain outnumber neurons by more than a factor of 1000, which implies that multi-terminal memristors are needed to perform complex functions such as heterosynaptic plasticity [3, 9-13]. Previous attempts to move beyond 2-terminal memristors include the 3-terminal Widrow-Hoff memistor [14] and field-effect transistors with nanoionic gates [15] or floating gates [16], albeit without memristive switching in the transistor [17].

Therefore, a heretofore unaddressed need exists in the art to address the aforementioned deficiencies and inadequacies.

SUMMARY OF THE INVENTION

One of the objectives of this invention is to provide circuitries and devices capable of neuromorphic computing, and in particular a scalable realization of a multi-terminal hybrid memristor and transistor (i.e., memtransistor) using a polycrystalline monolayer film of an atomically thin material, such as $MoS_2$ for example.

In one aspect, the invention relates to a memtransistor. In certain embodiments, the memtransistor includes a substrate having a first surface and an opposite, second surface; a polycrystalline monolayer film formed of an atomically thin material on the first surface of the substrate; an electrode array having a plurality of electrodes spatial-apart formed on the polycrystalline monolayer film such that each pair of electrodes defines a channel in the polycrystalline monolayer film therebetween; and a gate electrode formed on the second surface of the substrate and capacitively coupled with the channel. The polycrystalline monolayer film contains grains defining a plurality of grain boundaries thereof. In certain embodiments, the grains have an average grain size of about 1-10 μm.

In certain embodiments, the atomically thin material comprises $MoS_2$, $MoSe_2$, $WS_2$, $WSe_2$, or related two-dimensional materials.

In one embodiment, the substrate is formed of oxidized silicon ($SiO_2$), or dielectrics including alumina, hafnia, or zirconia.

In certain embodiments, the gate electrode is formed of highly doped silicon (Si), or other conductive materials.

In certain embodiments, each electrode of the electrode array is formed of a same metallic material or different metallic materials. In one embodiment, the electrode array is formed of at least one of gold (Au), titanium (Ti), and other conductive materials.

In certain embodiments, the memtransistor is configured such that the Schottky barrier localized at each electrode is dynamically tunable so as to cause switching from a high resistance state (HRS) to a low resistance state (LRS) or from the LRS to the HRS in the memtransistor. In certain embodiments, the memtransistor is an LRS-HRS memtransistor or an LRS-LRS memtransistor.

In certain embodiments, the memtransistor combines resistive switching with transistor gating to realize nonlinear charge transport with wide tunability of individual states and switching ratios.

In certain embodiments, a switching mechanism of the memtransistor is characterizable with two memristors at the contacts connected by a field-effect transistor.

In certain embodiments, the grain boundaries in the polycrystalline monolayer film enable the memtransistor to have large switching ratios and prevent electrical breakdown by lowering the Schottky barriers through dynamic defect migration, and control devices on single grains of the polycrystalline monolayer film show a qualitatively different reversible breakdown phenomenon.

In certain embodiments, the memtransistor is fabricated in a field-effect geometry with channel lengths (L) and widths (W), each varying from 1 μm to 250 μm. In one embodiment, L=1-15 μm, and W=100-150 μm.

In another aspect, the invention relates to a memtransistor. In certain embodiments, the memtransistor includes a polycrystalline monolayer film formed of an atomically thin material, where the polycrystalline monolayer film contains grains defining a plurality of grain boundaries thereof; and an electrode array formed on the polycrystalline monolayer film, wherein the electrode array has a plurality of electrodes electrically coupled with the polycrystalline monolayer film such that each pair of electrodes defines a channel in the polycrystalline monolayer film therebetween. In certain embodiments, the grains have an average grain size of about 1-10 μm.

In certain embodiments, the atomically thin material comprises $MoS_2$, $MoSe_2$, $WS_2$, $WSe_2$, or related two-dimensional materials.

In certain embodiments, each electrode of the electrode array is formed of a same metallic material or different metallic materials. In certain embodiments, the electrode array is formed of at least one of Au, Ti, and other conductive materials.

In certain embodiments, the memtransistor further includes a gate electrode capacitively coupled with the channel.

In certain embodiments, the gate electrode is formed of highly doped Si, or other conductive materials.

In certain embodiments, the memtransistor further has a dielectric layer formed between the polycrystalline monolayer film and the gate electrode. In certain embodiments, the dielectric layer is formed of $SiO_2$ or dielectrics including alumina, hafnia, or zirconia.

In certain embodiments, the memtransistor is configured such that the Schottky barrier localized at each electrode is dynamically tunable so as to cause switching from an HRS to an LRS or from the LRS to the HRS in the memtransistor.

In certain embodiments, the memtransistor combines resistive switching with transistor gating to realize nonlinear charge transport with wide tunability of individual states and switching ratios.

In certain embodiments, a switching mechanism of the memtransistor is characterizable with two memristors at the contacts connected by a field-effect transistor.

In certain embodiments, the grain boundaries in the polycrystalline monolayer film enable the memtransistor to have large switching ratios and prevent electrical breakdown by lowering the Schottky barriers through dynamic defect migration, and control devices on single grains of the polycrystalline monolayer film show a qualitatively different reversible breakdown phenomenon.

In yet another aspect, the invention relates to a circuitry has one or more memtransistors as disclosed above.

In one aspect, the invention relates to an electronic device has one or more memtransistors as disclosed above.

In another aspect, the invention relates to a method for fabricating a memtransistor. In certain embodiments, the method includes growing a polycrystalline monolayer film on a substrate, wherein the polycrystalline monolayer film contains grains defining a plurality of grain boundaries thereof; and forming an electrode array on the grown polycrystalline monolayer film, wherein the electrode array has a plurality of electrodes electrically coupled with the polycrystalline monolayer film such that each pair of electrodes defines a channel in the polycrystalline monolayer film therebetween.

In certain embodiments, the polycrystalline monolayer film is grown by chemical vapor deposition (CVD) on the substrates. In certain embodiments, the polycrystalline monolayer film comprises an atomically thin material of $MoS_2$, $MoSe_2$, $WS_2$, $WSe_2$, or related two-dimensional materials. In certain embodiments, the substrate is formed of $SiO_2$, or dielectrics including alumina, hafnia, or zirconia.

In certain embodiments, the method further includes, prior to forming the electrode array on the grown polycrystalline monolayer film, coating a film of photoresist on the polycrystalline monolayer film to form a first structure; baking the first structure; exposing the first structure to UV light and developing the exposed first structure to form a second structure; patterning the second structure with a resist mask by reactive ion etching to form a third structure; and submerging the third structure in an N-Methyl-2-pyrrolidone (NMP) bath to remove the resist mask to form a patterned polycrystalline monolayer strips. In certain embodiments, the memtransistor is an LRS-LRS memtransistors.

In certain embodiments, the method further includes, prior to coating the film of photoresist on the polycrystalline monolayer film, coating a film of polymethylglutarimide (PMGI) on the polycrystalline monolayer film; and baking the coated film of polymethylglutarimide (PMGI) on the polycrystalline monolayer film at about 170° C. for a period of time. In certain embodiments, the memtransistor is an LRS-HRS memtransistor.

In certain embodiments, the electrode array is formed by patterning a negative photoresist, followed by thermal evaporation of metals and lift-off in NMP.

In certain embodiments, the method further includes forming a gate electrode on the substrate such that the substrate is positioned between the gate electrode and the polycrystalline monolayer film, wherein the gate electrode is capacitively coupled with the channel. In certain embodiments, the gate electrode is formed of highly doped Si, or other conductive materials.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIGS. 1A-1G show architecture of the $MoS_2$ memtransistor according to embodiments of the invention. FIG. 1A shows optical micrograph of CVD-grown polycrystalline monolayer molybdenum disulfide ($MoS_2$). The darker regions are from sparse regions of bilayer $MoS_2$. FIG. 1B shows spatial mapping of photoluminescence intensity (wavelength=670 nm) for the area shown in FIG. 1A. The darkest regions correspond to bilayer $MoS_2$, while the additional features correspond to grain boundaries within monolayer $MoS_2$. FIG. 1C shows lateral force microscopy retrace image of monolayer $MoS_2$ showing grain boundaries (see FIG. 5E for topography image). FIG. 1D shows optical micrograph of an array of $MoS_2$ monolayer strips with varying width (W), etched by reactive ion etching (RIE) before metallization. FIG. 1E shows optical micrograph of fully fabricated $MoS_2$ memtransistors with varying channel length (L). FIG. 1F shows schematic of the $MoS_2$ memtransistor device on 300 nm thick thermal $SiO_2$ on doped Si (gate). FIG. 1G shows schematic of a memtransistor device.

FIG. 2A shows I-V characteristics (open circles) of a $MoS_2$ memtransistor (L=5 μm, W=100 μm) at a gate bias $V_G$=10 V. The direction of the drain bias ($V_D$) sweep 1→4 is highlighted with colored arrows. The sweep rate is 10 V/s throughout unless mentioned otherwise. The solid green line is simulated data from a memtransistor model (see FIGS. 11A-11E). FIG. 2B shows I-V characteristics showing 10 consecutive sweeps at each gate bias $V_G$ for the same device where the switching directions are shown by the curved arrows. $V_G$ was stepped down between each $V_D$ sweep cycle. FIG. 2C shows transfer characteristics of a memtransistor at $V_D$=0.1 V showing a shift in threshold voltage ($V_{th}$) and field-effect mobility (μ) from $V_{th}$=20 V and μ being about 0.6 $cm^2$/Vs in a high resistance state (HRS) to $V_{th}$=10 V and μ being about 0.3 $cm^2$/Vs in a low resistance state (LRS). The curves cross at $V_G$=$V_{cross}$ about 30 V. FIG. 2D shows endurance of current (top) and on/off ratio (bottom) characteristics at $V_D$=0.5 V in HRS (sweep 1) and LRS (sweep 2) states for 475 consecutive sweep cycles of a memristor at $V_G$=40 V (see FIGS. 7D-7K for all $I_D$-$V_D$ curves). FIG. 2E shows retention of HRS and LRS currents measured at $V_D$=100 mV and $V_G$=0 V for 24 hours. The inset shows the gate-tunability of the switching ratio. FIG. 2F shows histogram of the largest on/off ratio of 62 distinct memtransistors (L=5 μm, W=100 μm), where the distribution is fit with a log-normal curve with mean and variance in log($I_{LRS}/I_{HRS}$) of 1.96 and 0.54, respectively.

FIG. 3A shows EFM phase image of a $MoS_2$ memtransistor at $V_D$=5 V, $V_S$=0 V, and $V_{tip}$=0 V in forward HRS. FIG. 3B shows line profiles of EFM phase along the red dashed lines in FIG. 3A for EFM images taken at forward HRS, forward LRS, reverse HRS, and reverse LRS, respectively, as shown schematically on the right (see FIGS. 9C-9F for EFM images). Dashed ovals show band-bending near the source electrode in forward HRS and LRS and near the drain in reverse LRS and HRS. The dip near the drain in the top panel is a topography artifact. FIG. 3C shows $V_G$-dependent effective Schottky barrier height ($\Phi_b$) extracted from variable temperature conductivity measurements in HRS (top) and LRS (bottom). $V_{FB}$ is a value of $V_G$ where $\Phi_b$ deviates from the linear dependence of the thermionic emission model. The inset shows the flat band condition at $V_G$=$V_{FB}$=2 V, $\Phi_b$=125 meV in HRS and $V_{FB}$=−8 V, $\Phi_b$=80 meV in LRS (see FIGS. 10A-10D for details). FIG. 3D shows I-V characteristics of a LRS-LRS $MoS_2$ memtransistor with an about 1.5 nm thick photoresist layer under the metal contact at different $V_G$. The direction of the $V_D$ sweep 1→4 is highlighted by arrows. $V_G$ was stepped down between each $V_D$ sweep cycle. FIG. 3E shows schematic showing the energy band diagram of a LRS-LRS memtransistor at the 4 stages of switching shown in the center. $E_{fp}$ and $E_{fn}$ are non-equilibrium quasi-Fermi levels for holes and electrons, respectively (see FIGS. 12A-12E for details).

FIGS. 4A-4D show control devices and neural functions of memtransistors according to embodiments of the invention. FIG. 4A shows I-V characteristics (at $V_G$=60 V) of a control device on an individual monolayer $MoS_2$ domain without grain boundaries showing breakdown. The breakdown voltage ($V_{br}$) and breakdown current ($I_{br}$) are defined by the point preceding the sharp downward transition in sweep 1. The upper inset shows an AFM phase image of a device with degraded material near the source electrode (arrow). The lower inset shows a linear relation between $I_{br}$ and the width of source contact $W_s$ for 9 devices with different flake shapes (see FIGS. 13A-13J). FIG. 4B shows $I_{24}$-$V_{24}$ characteristics between terminal 2 and 4 of a 6-terminal $MoS_2$ memtransistor (left inset) at three stages of pulses at constant $V_G$=20 V: (1) black: before any pulse; (2) green: after applying four pulses of −80 V between terminals 5 and 6 while terminals 1-4 were floating; (3) red: after applying three pulses of −80 V between terminals 6 (drain) and 5 (ground) while terminals 1-4 were floating. The white dashed lines in the left inset show the edges of the patterned $MoS_2$. The right inset shows heterosynaptic plasticity by about 10-fold reversible changes in conductance (G=$I_{ij}/V_{ij}$) between all six combinations of four terminals, ij=12, 13, 14, 23, 24, and 34 (see FIGS. 14A-14H). FIG. 4C shows post-synaptic current (PSC) versus pulse number showing long-term potentiation and depression with 30 V and −30 V pulses, respectively. The solid lines show biexponential fits. FIG. 4D shows measured change in synaptic weight change (normalized to maximum weight) with relative time intervals between paired pulses of 40 V and −40 V. The solid lines are exponential fits with time constants of 1.6 and 5.5 msec for positive and negative pulses, respectively. The inset shows the timing scheme for indirect STDP. $V_G$=0 V throughout all measurements in FIGS. 4C and 4D.

FIGS. 5A-5F show materials characterization of the $MoS_2$ film according to embodiments of the invention. FIG. 5A shows Raman spectrum of CVD-grown polycrystalline monolayer $MoS_2$ using an excitation wavelength of 532 nm. Lorentzian peak fits correspond to $E^1_{2g}$ and $A_{1g}$ modes. FIG. 5B shows photoluminescence spectrum of $MoS_2$ collected in the same microscope. FIGS. 5C-5D show XPS spectra of $MoS_2$ on a $SiO_2$/Si substrate showing Mo 3d, S 2s, and S 2p peaks. FIG. 5E shows AFM topography image corresponding to the lateral force microscopy image in FIG. 1C. FIG. 5F shows AFM topography image of the edge a $MoS_2$ flake showing a monolayer step height of about 0.73 nm.

FIG. 6A shows AFM topography image of the $MoS_2$ crystals patterned by PMGI-assisted photolithography. The dashed green line shows the location of the edge of the patterned photoresist in the left region and the white dashed line shows the triangular $MoS_2$ crystal domain before reactive-ion etching (RIE) etching. FIG. 6B shows zoomed-in AFM topography image from the black dashed region in FIG. 6A showing checkerboard regions of protected (1) $MoS_2$, (2) etched $MoS_2$, (3) protected $SiO_2$, and (4) etched $SiO_2$. FIG. 6C shows height profiles taken along two horizontal lines in FIG. 6B showing minimal residue left on the protected $SiO_2$ region. FIG. 6D shows height profiles taken along two vertical lines in FIG. 6B showing minor etching of $SiO_2$ under the etched $MoS_2$ region (2). The noise in the height profiles is due to surface roughness and tip artifacts.

FIGS. 7A-7K show leakage, dependence on bias range, bipolar resistive switching, and endurance characteristics according to embodiments of the invention. FIG. 7A shows leakage current $I_G$-$V_G$ characteristics of the $MoS_2$ memtransistor from FIG. 2A after a high bias $V_D$ sweep from 80 V to −80 V. Note that current level of 100 pA is close to instrumentation noise floor. FIG. 7B shows $I_D$-$V_D$ characteristics of a memtransistor (L=15 μm, W=150 μm) for different $V_D$ sweep ranges from |20| to |80| V showing increasing switching ratio with sweep range (ratio >$10^3$ for |80| V range). FIG. 7C shows zoomed-in view of 50 sweep cycles of the device from FIG. 2B, showing an insulating state at a range of negative $V_D$ values that is dependent on $V_G$ and non-zero crossing suggesting memcapacitance from contacts. FIG. 7D shows $I_D$-$V_D$ characteristics of a $MoS_2$ memtransistor during 10 consecutive unipolar positive bias sweeps of $V_D$=0 V to 80 V. FIG. 7E shows $I_D$-$V_D$ characteristics of the same $MoS_2$ memtransistor during 10 consecutive unipolar negative bias sweeps of $V_D$=0 V to −80 V. FIG. 7F shows LRS to HRS switching of the $MoS_2$ memtransistor from FIG. 2B in forward bias for $V_G$>$V_{cross}$ where $V_{cross}$ about 35 V. FIGS. 7G-7K show $I_D$-$V_D$ characteristics of the device from FIG. 2D during 475 voltage sweeps: sweeps 1-100; sweeps 100-200; sweeps 200-300; sweeps 300-400; and sweeps 400-475, respectively.

FIGS. 8A-8E show current decay in endurance characteristics according to embodiments of the invention. FIG. 8A shows exponential and stretched exponential fits to a typical subset of endurance points from FIG. 2D. The stretched exponential function is defined as $I_D$~A−B·$e^{c(n_0-n)^\gamma}$ $I_D$~A−B·$e^{c(n_0-n)}$, where A, B, C, and $n_0$ are constants and the parameter γ≈0.8. Both the exponential and stretched exponential fits show $R^2$ being about 0.97, but the stretched exponential shows a better fit at the tail end. FIG. 8B shows endurance characteristics of a memtransistor showing only one exponential decay in reverse bias ($V_D$=−10 V). FIG. 8C shows $I_D$-$V_D$ characteristic ($V_G$=0 V) of a device with L=20 μm and W=150 μm showing negligible memristive loop (10 sweep cycles). FIG. 8D shows $I_D$-$V_D$ characteristic ($V_G$=60 V) of a device with L=10 μm and W=5 μm showing negligible memristive loop (19 sweep cycles). FIG. 8E shows HRS and LRS retention characteristics from FIG. 2E plotted and extrapolated in log-log scale. Relaxation of the two states is currently faster than conventional filament-based memristors such as $TiO_2$.

FIG. 9A shows schematic of the in situ EFM measurements of $MoS_2$ memtransistors. FIG. 9G-9O show EFM phase profiles along the red dashed lines 1-8 and 10 in FIGS. 9C-9D. EFM phase profile along line 9 is shown in FIG. 3B. All profiles are averaged over 128 lines and are normalized with the EFM phase values at the drain and source.

FIG. 10A shows $I_D$-$V_G$ characteristics of the device from FIG. 3C (in LRS) at $V_D$=0.1 V for temperature (T) varying from 300 K to 75 K at a step of 25 K. FIG. 10B shows plot of $\ln(I_D/T^{3/2})$ versus 1000/T for different $V_G$ to extract Schottky barrier height using the thermionic emission model [5,6]. FIGS. 10C-10D show $I_D$-$V_G$ and field-effect mobility versus $V_G$ of the same device in LRS and HRS, respectively. $V_{th}$ shifts by 15 V between HRS and LRS and $V_{cross}$ about 42 V are seen by crossing curves in FIG. 10C.

FIGS. 11A-11E show memtransistor modeling according to embodiments of the invention. FIG. 11A shows schematic of the increased doping region near the contact resulting in larger field and reduced metal-semiconductor Schottky barrier height. FIG. 11B shows simulated variation of $n_1 \cdot w_s$ at the source contact for forward bias (sweep 1 and 2 from FIG. 2A). FIG. 11C shows simulation variation of $n_1 \cdot w_d$ at the drain contact for reverse bias (sweep 3 and 4 from FIG. 2A). FIG. 11D shows simulated $I_D$-$V_D$ characteristics of a $MoS_2$ memtransistor in forward bias with different $V_G$ values in the range of 10 to −30 V. FIG. 11E shows simulated variation in $n_1 \cdot w_s$ for the same $V_G$ values. The legend between FIG. 11D and FIG. 11E applies to both plots.

FIGS. 12A-12E show LRS-LRS $MoS_2$ memtransistor characteristics and mechanism according to embodiments of the invention. FIG. 12A shows schematic of a LRS-LRS memtransistor where a thin photoresist layer acts as a tunnel barrier between the metal contacts and the $MoS_2$ film. FIG. 12B shows AFM topography images showing the step height of the photoresist left on a blank Si substrate from a process without using PMGI. Inset shows the height profile taken along the white dashed line revealing a thickness of about 1.5 nm. FIG. 12C shows gate-tunable I-V characteristics from FIG. 3D shown in the linear scale. FIG. 12D shows $I_D$-$V_D$ characteristics of 50 sweep cycles of a LRS-LRS memristor from FIG. 3D. FIG. 12E is a table showing resistive switching at the source and drain contacts in LRS-HRS and LRS-LRS memtransistors during four stages of a full sweep cycle. Conditions of relative resistance values necessary for the two different switching behaviors are listed in the top right corner. Three kinds of resistive switching events A, B, and C are shown by colored arrows.

FIG. 13A shows AFM topography images (corresponding to FIG. 4A upper inset) showing electromigration-induced degraded material (cyan arrow) near the source electrode (top). The color scale is adjusted to reveal height contrast. FIG. 13B shows AFM phase image of a device with hourglass-shaped channel (i.e., varying channel length L from 5 μm to 1 μm), showing dendritic feature along the entire source electrode (top). Without Schottky contacts, we expect a thermal hot-spot in the region of highest electric field ($V_D$/L) (i.e., only in the narrowest region in the center). Absence of such localized breakdown rules out Joule heating and favors electromigration near the source contact as the dominant phenomenon. Width of the source electrode edge ($W_s$) is shown by the white arrows. FIG. 13C shows $I_D$-$V_D$ characteristics (85 sweep cycles) of a degraded polycrystalline monolayer $MoS_2$ memtransistor at $V_G$=0 V (L=5 μm, W=100 μm). FIG. 13D shows AFM topography image of the device from FIG. 13C showing the dendritic features enclosed by a white dashed line near the source electrode. FIG. 13E shows a series of five snapshots (left to right) from a video captured by a black and white camera during sweep '3', as highlighted by the dashed red line in FIG. 13C. The red outline and dashed black line in the first frame show the probe tip and electrode pads, respectively. The middle three frames show bright spots from the light emission appearing in the channel close to the source electrode (right), as highlighted by black arrows. Light emission was observed during all 85 sweep cycles shown in FIG. 13C. FIG. 13F shows breakdown current ($I_{br}$, defined in FIG. 4a) showing linear correlation $W_s$ for 9 single-flake control MoS$_2$ devices. FIG. 13G shows breakdown voltage ($V_{br}$, defined in FIG. 4A) showing linear correlation with L, which suggests that most of the potential is dropped across the Schottky contacts. FIG. 13H shows power ($I_{br} \times V_{br}$) showing linear correlation with channel area (L×W). FIG. 13H shows $V_{br}$ showing no correlation with $W_s$. FIG. 13J shows $I_{br}$ also shows no correlation with L.

FIGS. 14A-14H show I-V characteristics, gate tunability and mechanism of multi-terminal heterosynaptic device according to embodiments of the invention. FIGS. 14A-14E shows low bias characteristics of 5 permutations of inner electrodes 1-4 in FIG. 4B at $V_G$=20 V, where ij=12, 13, 14, 23, 34, respectively. $I_{24}$-$V_{24}$ is shown in FIG. 4B. The legend in FIG. 14A applies to all FIGS. 14A-14E. The black curves are measured before any pulsing. The green curves were measured after applying a −80 V pulse at $V_{56}$ (5-drain, 6-source) four times at a voltage ramp rate of 10 V/s. The red curves were measured after applying a −80 V pulse at $V_{65}$ (6-drain, 5-course) three times at the same ramp rate. The conductance returns to the pre-pulse state in all combinations of electrodes. $I_{34}$-$V_{34}$ could not be measured after the $V_{65}$ pulse cycle. FIG. 14F shows change in conductance between 2-4 ($G_{24}$) with pulses $V_{56}$ and $V_{65}$ pulses for different $V_G$ showing gate-tunability of heterosynaptic plasticity. FIGS. 14G-14H show spatial profile of the MoS$_2$ conductance band minimum ($E_c$) along two dashed lines (FIG. 14G) passing through (x) and outside (y) the side electrodes.

DETAILED DESCRIPTION OF THE INVENTION

Figure 1G:
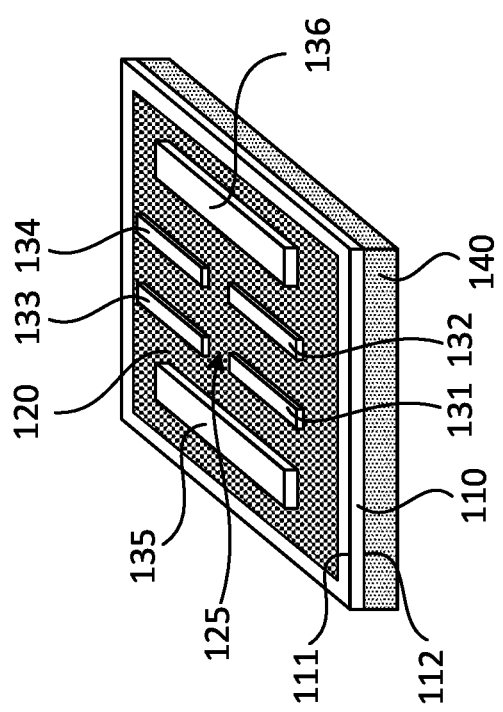

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein.

Synonyms for certain terms are provided. A recital of one or more synonyms does not exclude the use of other synonyms. The use of examples anywhere in this specification, including examples of any terms discussed herein, is illustrative only and in no way limits the scope and meaning of the invention or of any exemplified term. Likewise, the invention is not limited to various embodiments given in this specification.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present invention.

It will be understood that, as used in the description herein and throughout the claims that follow, the meaning of "a", "an", and "the" includes plural reference unless the context clearly dictates otherwise. Also, it will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

It will be further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used in this disclosure, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this disclosure, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Computer algorithms might be performing brain-like functions, such as facial recognition and language translation, but the computers themselves have yet to operate like brains. Computers have separate processing and memory storage units, whereas the brain uses neurons to perform both functions. Neural networks can achieve complicated computation with significantly lower energy consumption compared to a digital computer. In recent years, researchers have searched for ways to make computers more neuromorphic, or brain-like, in order to perform increasingly complicated tasks with high efficiency. The field of neuromorphic computing is emerging as a leading candidate for next-generation integrated circuit technology. Historically, progress in this field has been enabled by aggressive scaling in silicon transistor technology and corresponding algorithm optimization. However, memristors better mimic the function of biological neurons than conventional silicon transistors due to physically similar ion-mediated switching. Despite this advantage, the memristor geometry is limited to two electrodes, whereas multiple connections (synapses) between individual devices (neurons) are desired for parallel computing.

This invention discloses, among other things, a multi-terminal memtransistor that combines the desirable attributes of transistors and memristors in one device, and provides a direct pathway to increasing the number of connections. The switching is achieved by defect migration in a polycrystalline monolayer film of atomically thin material (e.g., $MoS_2$) near the electrical contacts, as verified by physical modeling. Technologically relevant device metrics such as endurance, retention, and large-area scaling are demonstrated. Furthermore, the neuromorphic function of heterosynaptic plasticity is demonstrated in a multi-electrode memtransistor. Overall, this device concept is expected to serve as a foundational circuit element of brain-inspired computing.

In one aspect of the invention, as shown in FIGS. 1A-1G and particularly in FIGS. 1F-1G, the memtransistor includes a substrate 110 having a first surface 111 and an opposite, second surface 112; a polycrystalline monolayer film 120 formed of an atomically thin material on the first surface 111 of the substrate 110; an electrode array having a plurality of electrodes 131-136 spatial-apart formed on the polycrystalline monolayer film 120 such that each pair of electrodes defines a channel 125 in the polycrystalline monolayer film 120 therebetween; and a gate electrode 140 formed on the second surface 112 of the substrate 110 and capacitively coupled with the channel 125. The polycrystalline monolayer film 120 contains grains defining a plurality of grain boundaries thereof, as shown in FIGS. 1B-1C for example. In certain embodiments, the grains have an average grain size of about 1-10 μm.

In certain embodiments, the atomically thin material comprises $MoS_2$, $MoSe_2$, $WS_2$, $WSe_2$, or related two-dimensional materials.

In one embodiment, the substrate 110 is formed of $SiO_2$, or dielectrics including alumina, hafnia, or zirconia.

In certain embodiments, the gate electrode 140 is formed of highly doped Si, or other conductive materials.

In certain embodiments, each electrode 131/132/ . . . /136 of the electrode array is formed of a same metallic material or different metallic materials. In one embodiment, the electrode array is formed of at least one of Au, Ti, and other conductive materials.

In certain embodiments, the memtransistor is configured such that the Schottky barrier localized at each electrode is dynamically tunable so as to cause switching from a high resistance state (HRS) to a low resistance state (LRS) or from the LRS to the HRS in the memtransistor. In certain embodiments, the memtransistor is an LRS-HRS memtransistor or an LRS-LRS memtransistor.

In certain embodiments, the memtransistor combines resistive switching with transistor gating to realize nonlinear charge transport with wide tunability of individual states and switching ratios.

In certain embodiments, a switching mechanism of the memtransistor is characterizable with two memristors at the contacts connected by a field-effect transistor.

In certain embodiments, the grain boundaries in the polycrystalline monolayer film enable the memtransistor to have large switching ratios and prevent electrical breakdown by lowering the Schottky barriers through dynamic defect migration, and control devices on single grains of the polycrystalline monolayer film show a qualitatively different reversible breakdown phenomenon.

In certain embodiments, the memtransistor is fabricated in a field-effect geometry with channel lengths (L) and widths (W), each varying from 1 μm to 250 μm, as shown in FIGS. 1D-1E. In one embodiment, L=1-15 μm, and W=100-150 μm.

In another aspect of the invention, the memtransistor includes a polycrystalline monolayer film formed of an atomically thin material, where the polycrystalline monolayer film contains grains defining a plurality of grain boundaries thereof; and an electrode array formed on the polycrystalline monolayer film, wherein the electrode array has a plurality of electrodes electrically coupled with the polycrystalline monolayer film such that each pair of electrodes defines a channel in the polycrystalline monolayer film therebetween. In certain embodiments, the grains have an average grain size of about 1-10 μm. In certain embodiments, the atomically thin material comprises $MoS_2$, $MoSe_2$, $WS_2$, $WSe_2$, or related two-dimensional materials.

In certain embodiments, the memtransistor further includes a gate electrode capacitively coupled with the channel. In certain embodiments, the gate electrode is formed of highly doped Si, or other conductive materials.

In certain embodiments, the memtransistor further has a dielectric layer formed between the polycrystalline monolayer film and the gate electrode. In certain embodiments, the dielectric layer is formed of $SiO_2$ or dielectrics including alumina, hafnia, or zirconia.

In certain embodiments, the memtransistor is configured such that the Schottky barrier localized at each electrode is dynamically tunable so as to cause switching from an HRS to an LRS or from the LRS to the HRS in the memtransistor.

In certain embodiments, the memtransistor combines resistive switching with transistor gating to realize nonlinear charge transport with wide tunability of individual states and switching ratios.

In certain embodiments, a switching mechanism of the memtransistor is characterizable with two memristors at the contacts connected by a field-effect transistor.

In certain embodiments, the grain boundaries in the polycrystalline monolayer film enable the memtransistor to have large switching ratios and prevent electrical breakdown by lowering the Schottky barriers through dynamic defect migration, and control devices on single grains of the polycrystalline monolayer film show a qualitatively different reversible breakdown phenomenon.

In yet another aspect, the invention relates to a method for fabricating a memtransistor. The method includes growing a polycrystalline monolayer film on a substrate, where the polycrystalline monolayer film contains grains defining a plurality of grain boundaries thereof; and forming an electrode array on the grown polycrystalline monolayer film, wherein the electrode array has a plurality of electrodes electrically coupled with the polycrystalline monolayer film such that each pair of electrodes defines a channel in the polycrystalline monolayer film therebetween.

In certain embodiments, the polycrystalline monolayer film is grown by chemical vapor deposition (CVD) on the substrates. In certain embodiments, the polycrystalline monolayer film comprises an atomically thin material of $MoS_2$, $MoSe_2$, $WS_2$, $WSe_2$, or related two-dimensional materials. In certain embodiments, the substrate is formed of $SiO_2$, or dielectrics including alumina, hafnia, or zirconia.

In certain embodiments, the method further includes, prior to forming the electrode array on the grown polycrystalline monolayer film, coating a film of photoresist on the polycrystalline monolayer film to form a first structure; baking the first structure; exposing the first structure to UV light and developing the exposed first structure to form a second structure; patterning the second structure with a resist mask by reactive ion etching to form a third structure; and submerging the third structure in an N-Methyl-2-pyrrolidone (NMP) bath to remove the resist mask to form a patterned polycrystalline monolayer strips. Accordingly, the memtransistor is an LRS-LRS memtransistors.

In certain embodiments, the method further includes, prior to coating the film of photoresist on the polycrystalline monolayer film, coating a film of polymethylglutarimide (PMGI) on the polycrystalline monolayer film; and baking the coated film of PMGI on the polycrystalline monolayer film at about 170° C. for a period of time. Accordingly, the memtransistor is an LRS-HRS memtransistor.

In certain embodiments, the electrode array is formed by patterning a negative photoresist, followed by thermal evaporation of metals and lift-off in NMP.

In certain embodiments, the method further includes forming a gate electrode on the substrate such that the substrate is positioned between the gate electrode and the polycrystalline monolayer film, wherein the gate electrode is capacitively coupled with the channel. In certain embodiments, the gate electrode is formed of highly doped Si, or other conductive materials.

In one aspect, the invention relates to a circuitry has one or more memtransistors as disclosed above.

In another aspect, the invention relates to an electronic device has one or more memtransistors as disclosed above.

According to the invention, the multi-terminal memtransistor operates much like a neuron by performing both memory and information processing. With combined characteristics of a memristor and transistor, the memtransistor also encompasses multiple terminals that operate more similarly to a neural network. The multi-terminal memtransistor can be applied for, but are not limited to, the fields of artificial neuromorphic circuits with more than two syanpses; heterosynaptic plasticity; gate-tunable crossbar memristor arrays; and parallel computing via multi-terminals. The multi-terminal memtransistor enables more advanced neuromorphic circuits that better mimic the behavior of biological neurons than pre-existing devices, thus significantly advancing the prospects for neuromorphic computing, and has a great deal of advantages over conventional silicon complementary metal-oxide-semiconductor (CMOS) devices and memristors that may mimic very simple neural functions with 2 or 3 electrodes, whereas biological neurons have thousands of synapses for massively parallel computing.

In one exemplary implementation of the memtransistor, atomically thin molybdenum disulfide ($MoS_2$) with well-defined grain boundaries is used influence the flow of current. Similar to the way fibers are arranged in wood, atoms are arranged into ordered domains—called "grains"—within a material. When a large voltage is applied, the grain boundaries facilitate atomic motion, causing a change in resistance. Because $MoS_2$ is atomically thin, it is easily influenced by applied electric fields. This property allows one to make a transistor. The memristor characteristics come from the fact that the defects in the material are relatively mobile, especially in the presence of grain boundaries. The memristor previously reported by the co-inventors [20] uses individual, small flakes of $MoS_2$. However, the invented memtransistor makes use of a continuous film of polycrystalline $MoS_2$ that comprises a large number of smaller flakes. This enabled one to scale up the device from one flake to many devices across an entire wafer. When the length of the device is larger than the individual grain size, it is guaranteed to have grain boundaries in every device across the wafer. Thus, reproducible, gate-tunable memristive responses across large arrays of devices can be achieved.

After fabricating memtransistors uniformly across an entire wafer, additional electrical contacts are added. Typical transistors and memristor each have three terminals. Accordingly one embodiment of the invention, a seven-terminal device is realized, in which one terminal controls the current among the other six terminals. This is even more similar to neurons in the brain, because in the brain, one neuron is not usually connected to only one other neuron. Instead, one neuron is connected to multiple other neurons to form a network. The device structure according to the invention allows multiple contacts, which is similar to the multiple synapses in neurons. Accordingly, the memtransistor can be a foundational circuit element for new forms of neuromorphic computing.

These and other aspects of the present invention are further described in the following section. Without intending to limit the scope of the invention, further exemplary implementations of the present invention according to the embodiments of the present invention are given below. Note that titles or subtitles may be used in the examples for the convenience of a reader, which in no way should limit the scope of the invention. Moreover, certain theories are proposed and disclosed herein; however, in no way should they, whether they are right or wrong, limit the scope of the invention so long as the invention is practiced according to the invention without regard for any particular theory or scheme of action.

Multi-Terminal Memtransistor from Polycrystalline Monolayer MoS$_2$

In this exemplary embodiment, a 6-terminal memtransistor using polycrystalline monolayer MoS$_2$ is provided. The two-dimensional (2D) MoS$_2$ memtransistor shows gate tunability in individual states by 4 orders of magnitude in addition to large switching ratios with high cycling endurance and long-term retention of states. In addition to conventional neural learning behavior of long-term potentiation/depression, the 6-terminal MoS$_2$ memtransistor possesses gate-tunable heterosynaptic functionality that is not achievable using 2-terminal memristors. For example, the conductance between a pair of two floating electrodes (pre-synaptic and post-synaptic neurons) is varied by about 10 times by applying voltage pulses to modulatory terminals. In situ scanning probe microscopy, cryogenic charge transport measurements, and device modeling reveal that bias-induced MoS$_2$ defect motion drives resistive switching by dynamically varying Schottky barrier heights. Overall, the seamless integration of a memristor and transistor into one multi-terminal device has the potential to enable complex neuromorphic computing in addition to providing opportunities for studying the unique physics of defect kinetics in 2D materials.

In the embodiment, uniform polycrystalline monolayer MoS$_2$ films with an average grain size of 3-5 μm were grown by chemical vapor deposition (CVD) on SiO$_2$/Si substrates and characterized using X-ray photoelectron, photoluminescence, and Raman spectroscopies, as shown in FIGS. 1A-1C and 5A-5F. MoS$_2$ memtransistors were fabricated in a field-effect geometry with channel lengths (L) and widths (W) varying from 5 μm to 150 μm shown in FIGS. 1D-1F. Since clean interfaces between MoS$_2$ channels and metal electrodes were found to be critical, an unconventional photolithography process was developed based on a polymethylglutarimide (PMGI) and photoresist bilayer, as shown in FIGS. 6A-6D.

Figure 2A:
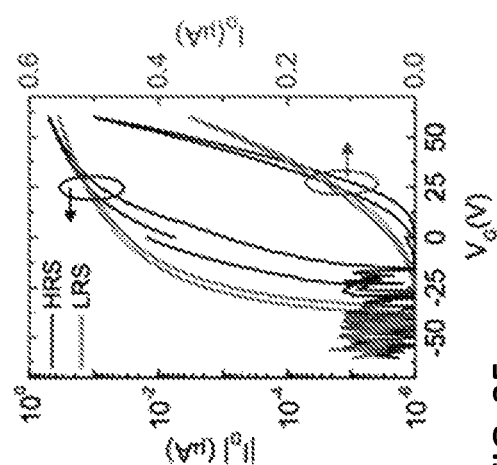
FIGS. 2A-2F show charge transport characteristics, endurance, retention, and statistics of $MoS_2$ memtransistors according to embodiments of the invention.
Figure 2B:
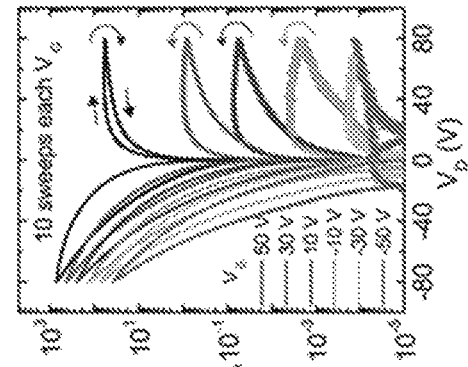
Figure 2C:
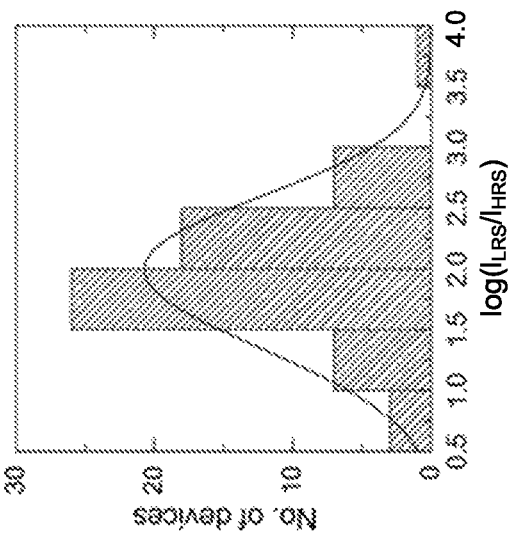

At large drain bias V$_D$ in the sub-threshold regime (gate bias V$_G$<threshold voltage V$_{th}$), a typical memtransistor is in a high resistance state (HRS) for the V$_D$ sweep from 0 to 80 V (sweep 1) and gradually changes to a low resistance state (LRS), as shown in FIG. 2A. The device maintains LRS during the sweep from 80 to 0 V (sweep 2), resets to HRS during the sweep from 0 to -80 V (sweep 3), and maintains HRS from -80 to 0 V (sweep 4). Thus, these devices act as LRS-HRS memtransistors. FIG. 2B shows that when V$_G$ is varied from 50 to -50 V, both LRS and HRS resistances change by a factor of about 10$^4$ and the switching ratio (I$_{LRS}$/I$_{HRS}$ at V$_D$=0.5 V) is tuned from 300 to 8 (inset FIG. 2E). Due to the n-type MoS$_2$ channel, the forward-biased (V$_D$>0 V) device is completely OFF at V$_G$=-50 V, as shown in FIG. 2C, and the reverse-biased (V$_D$<0 V) device is insulating for a range of V$_D$ depending on the applied V$_G$), as shown in FIGS. 2B and 7C. The gate leakage (I$_G$-V$_G$) remains below 200 pA during high V$_D$ and V$_G$ sweeps, as shown in FIG. 7A.

Unlike filament-based resistive switching, MoS$_2$ memtransistors do not require an electroforming process, although the switching ratio increases with increasing V$_D$ sweep range, as shown in FIG. 7B. The largest switching ratio of greater than 10$^2$ was obtained from devices with W=100-150 μm and L=5-15 μm. The devices show bipolar resistive switching where reversing the bias polarity is essential to restoring the initial resistance states, as shown in FIGS. 7D-7E. The hysteresis in the I$_D$-V$_D$ characteristics of these MoS$_2$ memtransistors is fundamentally distinct from commonly reported hysteresis in I$_D$-V$_G$ curves due to oxide-related traps in field-effect transistors [23, 24]. Instead, the transfer characteristics (I$_D$-V$_G$) of MoS$_2$ memtransistors in LRS and HRS show significant shifts (about 10 V) in threshold voltage (V$_{th}$) with curves that cross each other at V$_G$=V$_{cross}$, as shown in FIG. 2C. HRS shows up to 100 times higher resistance for V$_G$<V$_{cross}$ and 2 times higher field-effect mobility (μ) at V$_G$>V$_{cross}$ compared to LRS. Therefore, the forward bias switching loop changes from counterclockwise (LRS to HRS) for V$_G$<V$_{cross}$ to clockwise (HRS to LRS) for V$_G$>V$_{cross}$, as shown in FIGS. 2B and 7F.

Figure 2D:
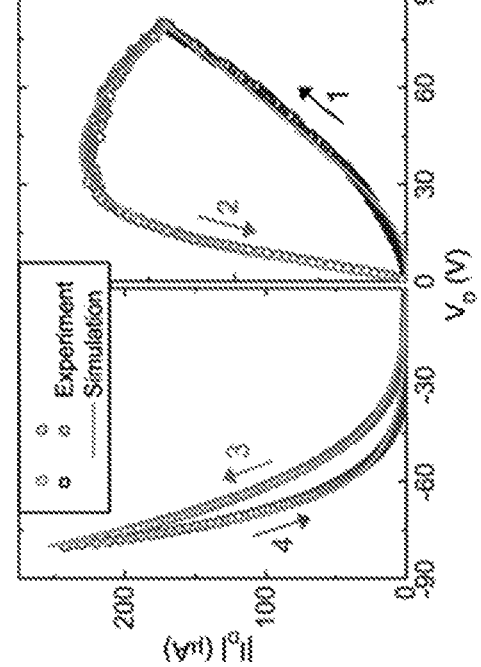
Figure 2E:
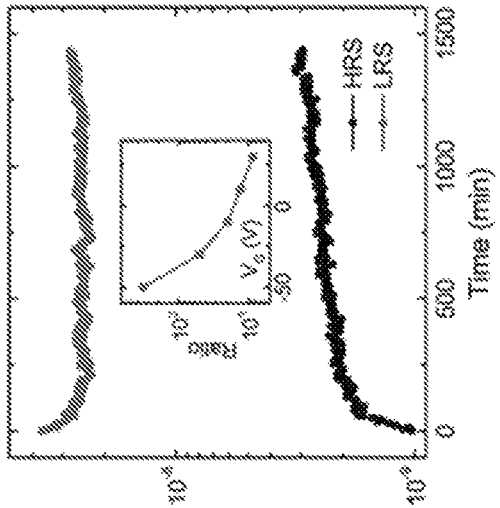
Figure 2F:
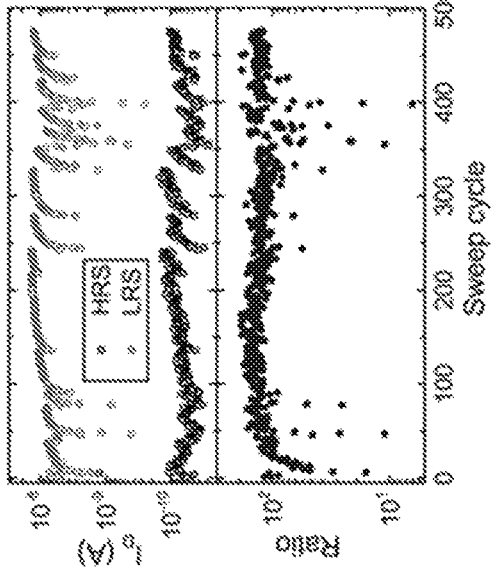

FIG. 2D shows endurance characteristics for a MoS$_2$ memtransistor that was switched 475 times between LRS and HRS through full sweep cycles. Within a subset, I$_D$ saturates to an upper value via stretched exponentials, as shown in FIGS. 7G-7K and 8A. Between neighboring subsets, I$_D$ jumps randomly to an about 10 times smaller value followed by the same inverse exponential growth, which suggests an oxide-related trap-release process activated by large fields near the source electrode in forward bias [23]. This behavior is reduced under reverse-bias, as shown in FIG. 8B, possibly due to smaller band-bending near the drain electrode in reverse bias. Since both HRS and LRS show similar transitory decays, the switching ratio (about 100) remains relatively constant, as shown in FIG. 2D. Individual resistance states measured up to 24 hours show a projected retention of distinct states for timescales on the order of years, as shown in FIGS. 2E and 8E. A statistical study of 62 devices that were fabricated with identical geometry on a single chip showed a log-normal distribution of switching ratios, as shown in FIG. 2F. Device-to-device variability is attributed to spatial inhomogeneity in the CVD MoS$_2$ film.

Figures 3A, 3B, 3C:
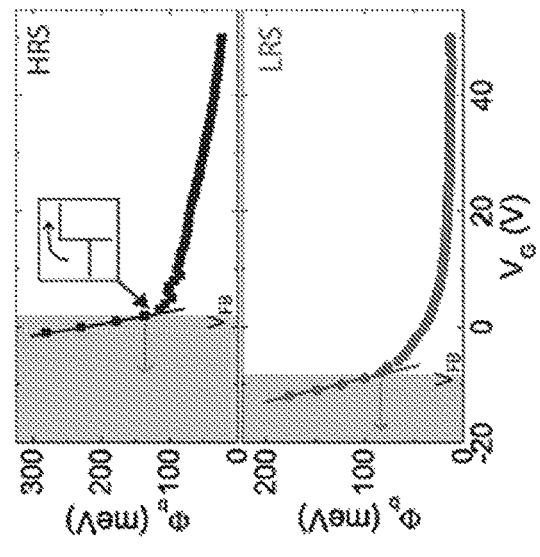
FIGS. 3A-3E show in situ measurements and switching mechanism according to embodiments of the invention.
Figure 9B:
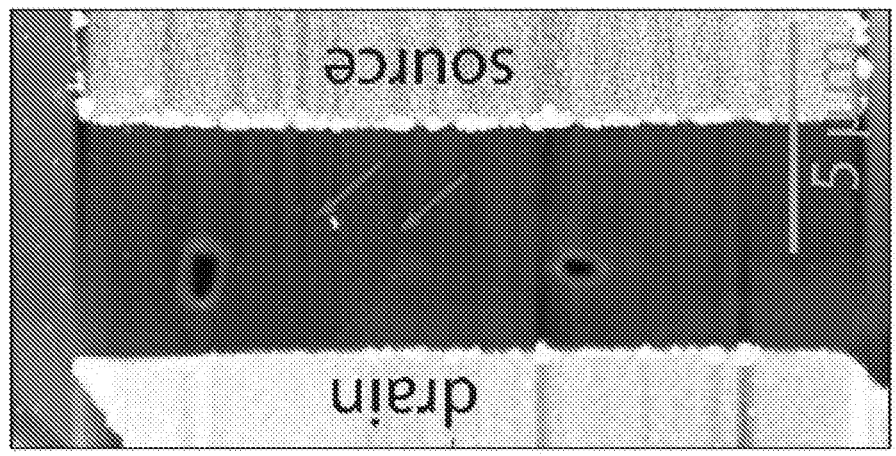
FIG. 9B shows AFM topography image of the device from FIG. 3A showing grain boundaries highlighted by red arrows.
Figure 9A:
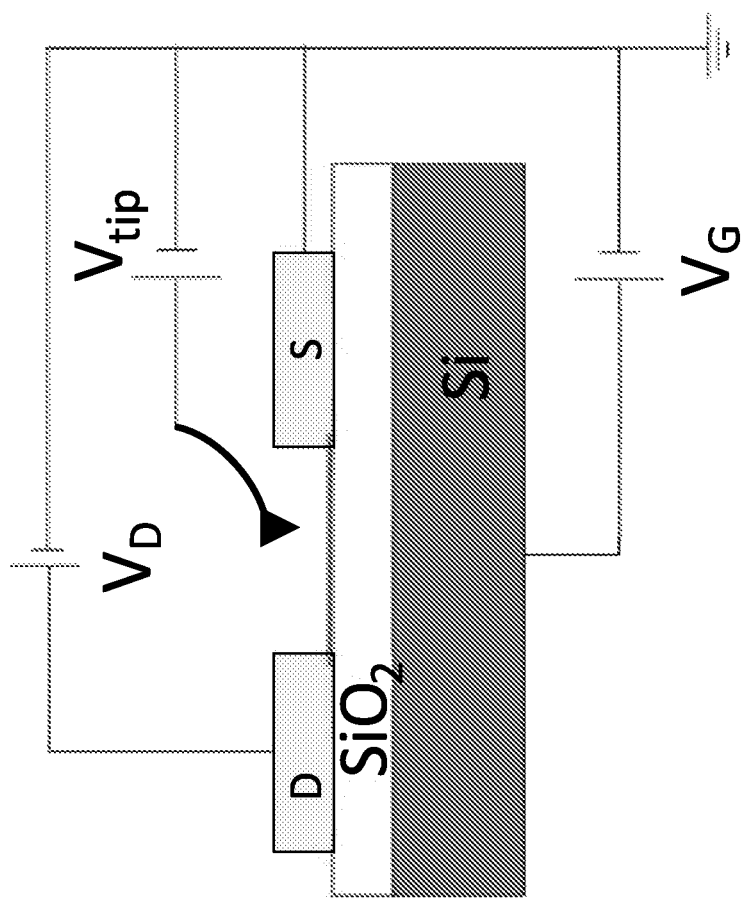
FIGS. 9A-9O show in-situ electrostatic force microscopy (EFM) of a $MoS_2$ memtransistor according to embodiments of the invention.
Figures 9C, 9D, 9E, 9F:
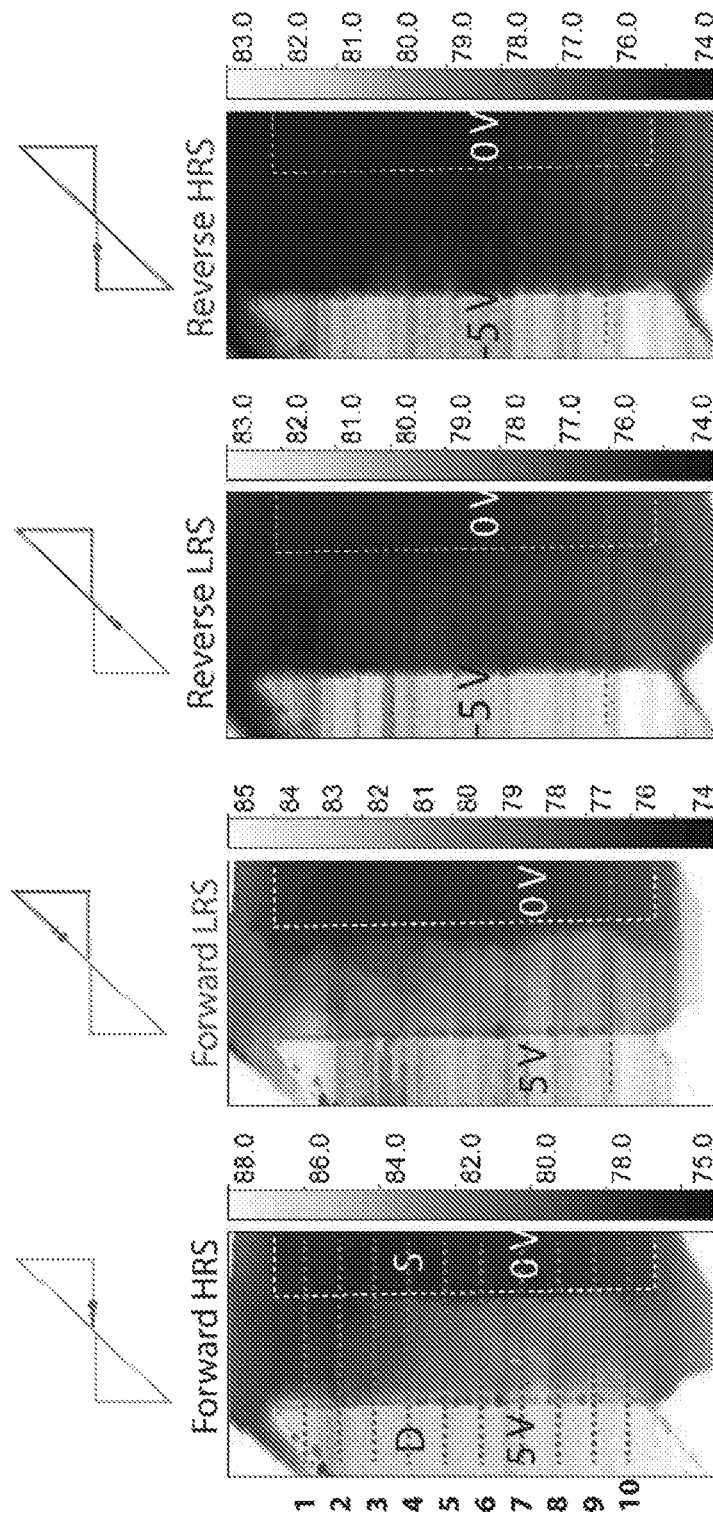
FIG. 9C shows reproduction of the EFM phase images from FIG. 3A in forward HRS. The phase signal profiles along the red dashed lines numbered from 1 to 10 from top to bottom are shown in FIGS. 11A-11E.
FIGS. 9D-9F show EFM phase images in forward LRS, reverse LRS, and reverse HRS, respectively, that are used for line profiles shown in FIG. 3B.
Figure 9G:
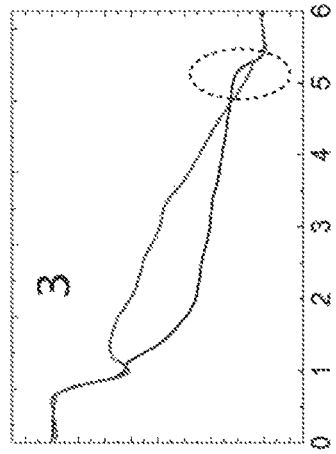
Figure 9H:
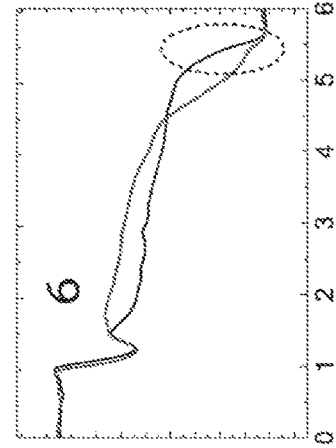
Figure 9I:
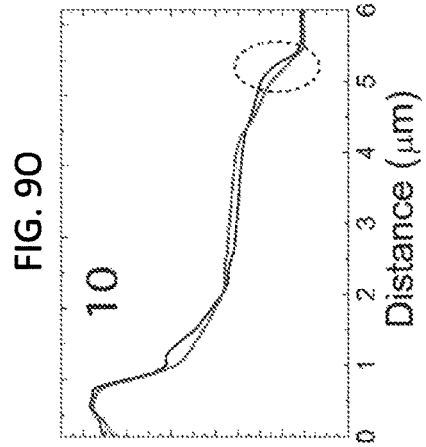
Figure 9J:
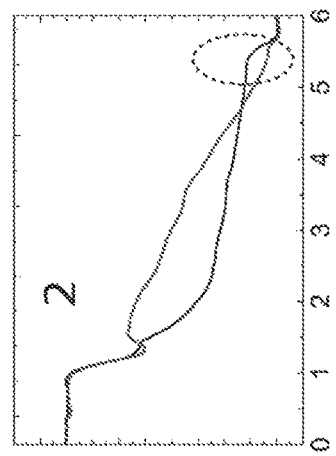
Figure 9K:
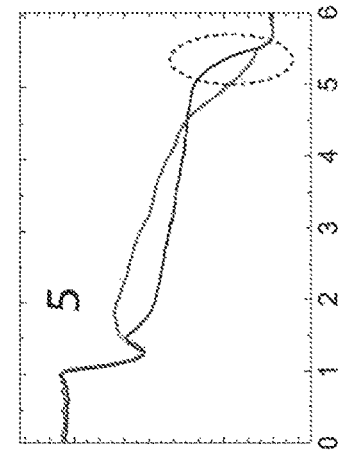
Figure 9L:
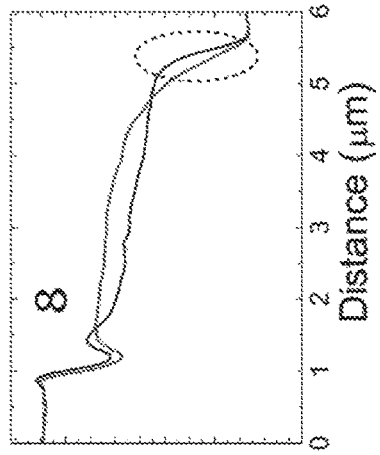
Figure 9M:
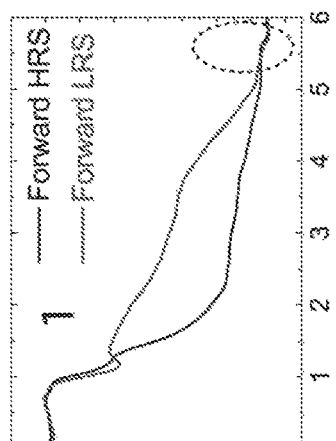
Figure 9N:
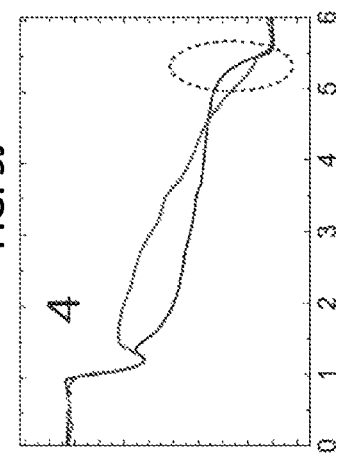
Figure 9O:
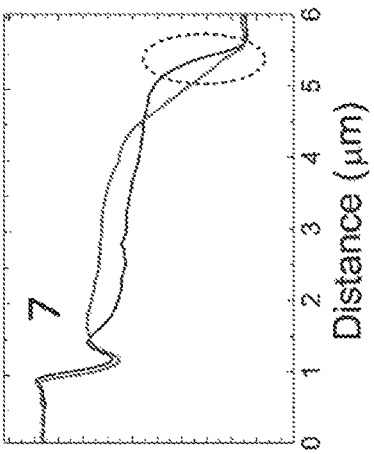
Figure 10A:
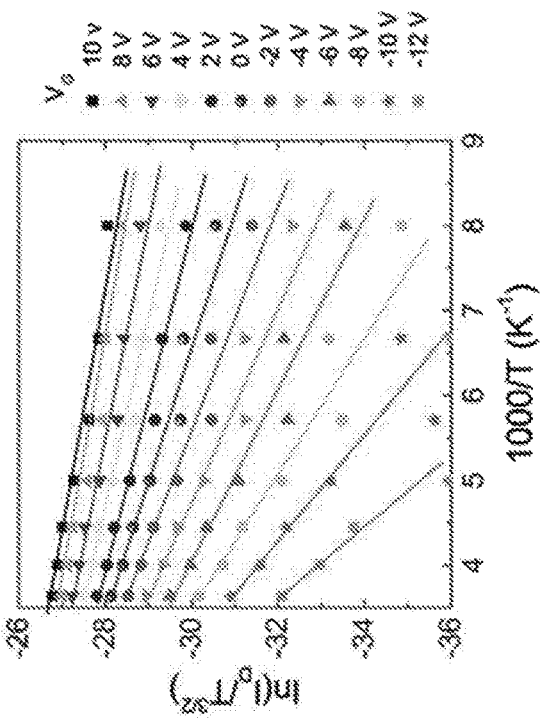
FIGS. 10A-10D show low temperature transport measurements of a $MoS_2$ memtransistor according to embodiments of the invention.
Figure 10B:
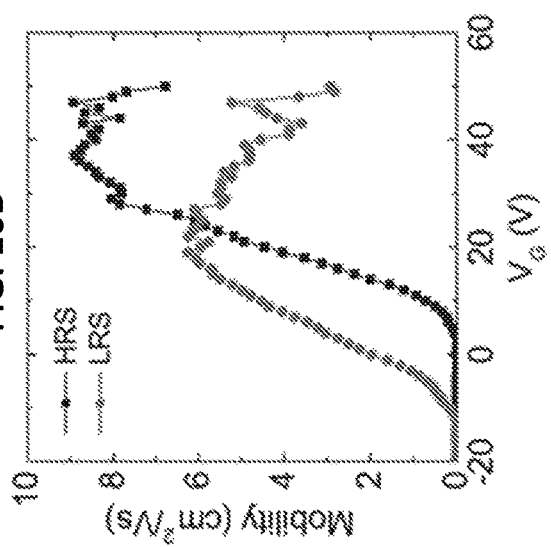
Figure 10C:
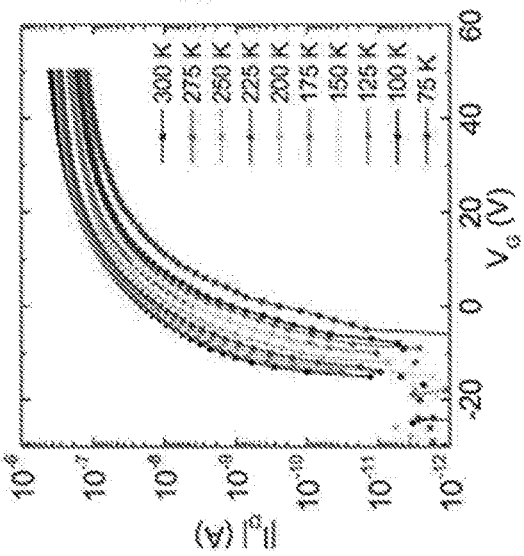
Figure 10D:
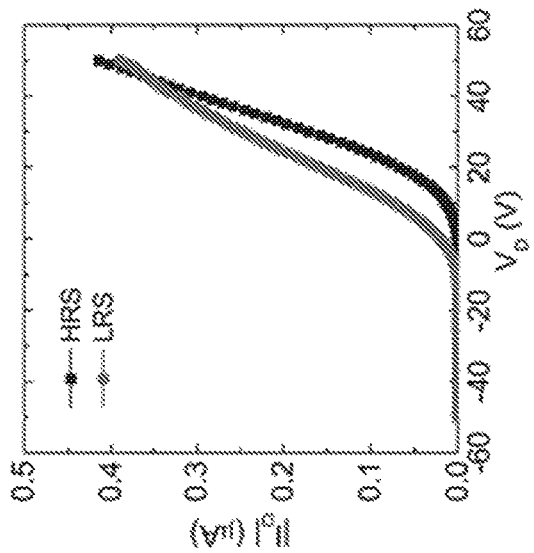

Due to its 2D nature, the MoS$_2$ channel allows the switching mechanism to be probed via in situ electrostatic force microscopy (EFM) as shown in FIGS. 3A-3B. The drain contact and conductive cantilever tip were biased independently, as shown in FIGS. 9A-9O, while the cantilever phase shift was recorded as the tip traced the topography profile 50 nm above the surface. Since the phase shift is proportional to the square of the potential difference between the tip and the underlying surface, the phase image provides a map of the local potential [20]. Line profiles reveal a sharper potential drop (larger field) at the source in forward HRS compared to forward LRS, suggesting a larger contact resistance in HRS than LRS, as shown in FIG. 3B. Reverse HRS also shows a larger field at the drain compared to reverse LRS, although this difference is smaller, consistent with the smaller switching ratio at reverse bias. Multiple line profiles confirm that the differences in HRS and LRS electric fields are consistent along the entire channel width, despite grain boundary induced EFM phase variations away from the contacts, as shown in FIGS. 9G-9O. Since a reverse-biased Schottky diode at the source (drain) dominates $I_D$ at $V_D>0$ ($V_D<0$), EFM measurements provide direct evidence that the HRS to LRS (LRS to HRS) switching in memtransistors is caused by dynamic tuning of Schottky barriers. Using variable temperature (T) charge transport measurements and assuming a 2D thermionic emission model, the effective barrier heights ($\Phi_b$) in different states are extracted from the slope of $\ln(I/T^{3/2})$ versus $1/T$ at different $V_G$, as shown in FIGS. 10A-10D. Thermionic emission dominates at $V_G<V_{FB}$ (flat-band voltage) producing linearly varying $\Phi_b$ with $V_G$. Thermally-assisted tunneling through a deformed Schottky barrier begins to contribute at $V_G>V_{FB}$, resulting in deviation from the linear trend, as shown in FIG. 3C. Thus, the Schottky barrier height ($\Phi_{sb}=\Phi_b$) is extracted from $V_G=V_{FB}$. $V_{FB}$ decreases from 2 V (HRS) to −8 V (LRS), consistent with a $V_{th}$ shift of 15 V for the same device, as shown in FIGS. 10A-10D. In addition, $\Phi_{sb}$ decreases from 125 meV (HRS) to 80 meV (LRS), confirming the observations from EFM.

Figure 12D:
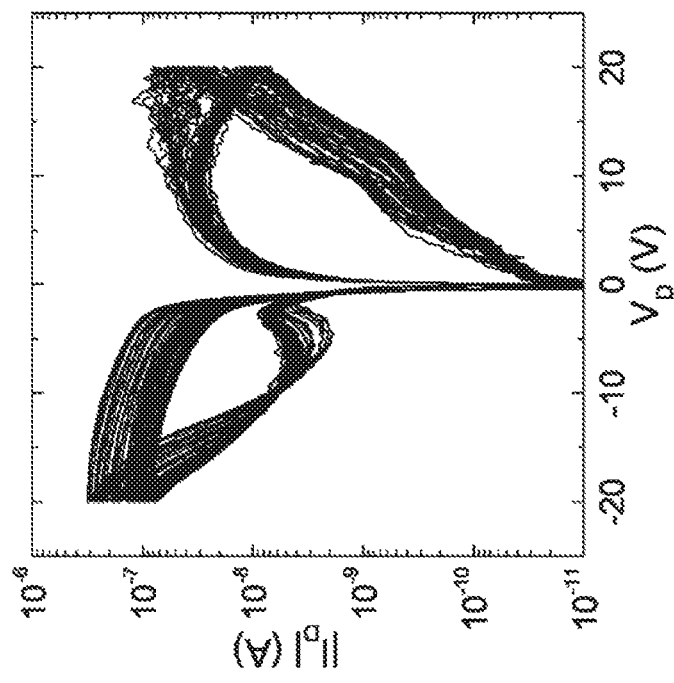
Figure 12C:
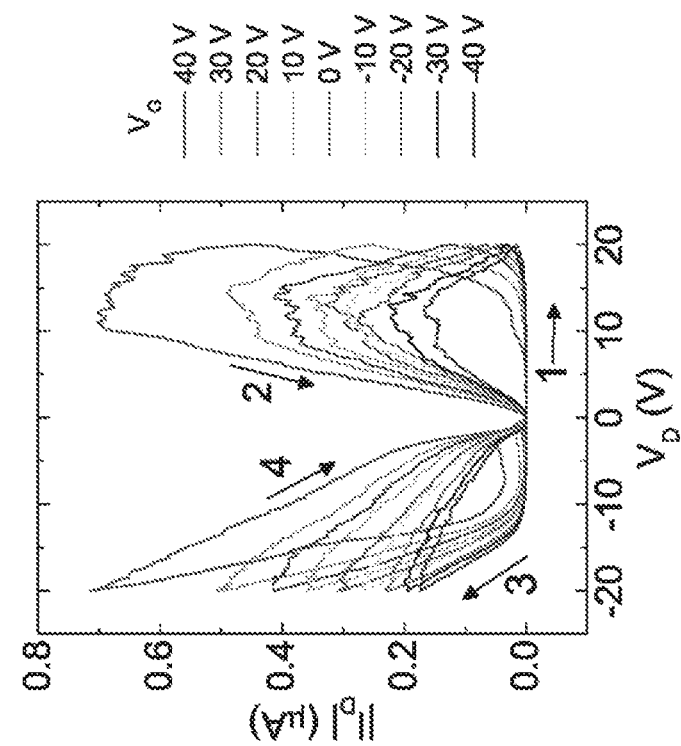
Figure 12E:
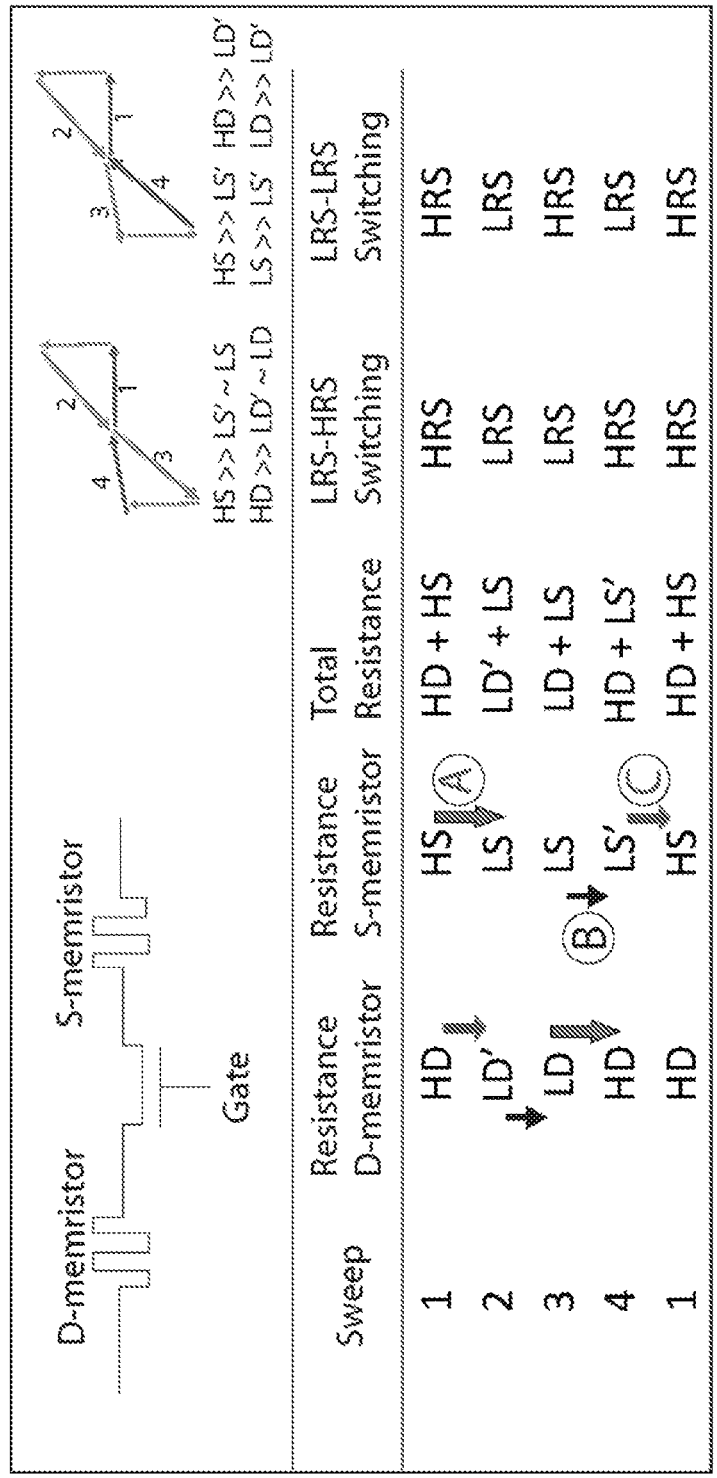

Charge transport in $MoS_2$ LRS-HRS memtransistors can be described by Schottky barrier transistors, e.g., equations (1) and (2) below, where $\Phi_b$ is a function an internal state variable (w) defined as the width of the region with excess dopants ($\Delta n$), as shown in FIG. 11A [1, 17, 25]. Tuning the Schottky barrier through increased doping near contacts ($\Phi_b \sim \sqrt{\Delta n \cdot w}$) is a standard practice in conventional field-effect transistors [26, 27]. Similarly, we propose that defects in $MoS_2$ act as dopants with their local migration under an applied bias being facilitated by grain boundaries, as previously observed under transmission electron microscopy and explained by ab initio calculations [18, 19, 21]. Thus, we develop a memtransistor model where the effective $\Phi_b$ changes by image charge lowering and tunneling at high biases, resulting in the following coupled equations:

$$I_D = D \exp\left(\frac{e(V_G - V_{th})}{c_r.k_B T}\right)\left(1 - \exp\left(-\frac{eV_D}{k_B T}\right)\right) \exp\left(\frac{\Phi_b(w)}{k_B T}\right) \quad (1)$$

$$\Phi_b(w) = \phi_{b0} - \frac{e}{\varepsilon_s}\sqrt{\frac{\Delta n \cdot w}{4\pi}} + \sqrt{\frac{e}{4\pi\varepsilon_s}}\left(\frac{2en(\phi_{b0} + A|V_d|)}{\varepsilon_s}\right)^{1/4} \quad (2)$$

$$\frac{\partial w}{\partial t} = E \cdot I_D\{1 - [(w - 0.5)^2 + 0.75]^p\} \quad (3)$$

where A, D, E, and $\phi_{b0}$ are fitting parameters, and e, n, $\varepsilon_s$ are electronic charge, doping level, and dielectric constant of monolayer $MoS_2$, respectively. Equation (3) captures the non-linear kinetics of the dopants near the contacts using a window function where the degree of non-linearity is defined by a positive integer p [28]. This model agrees well with the experimental data, as shown in FIGS. 2A and 11A-11E, and helps establish that the dependence of w on $V_G$ (through $I_D$) embodies the most essential feature of the $MoS_2$ memtransistor and distinguishes it from a 2-terminal memristor [17]. To further illustrate the non-trivial switching, we fabricated $MoS_2$ devices without the PMGI-based process and used residual about 1.5 nm thick photoresist layer as a tunneling barrier between $MoS_2$ and the metal contacts, as shown in FIGS. 3D-3E and 12A-12E. The tunneling barrier de-pins the Fermi level and causes the resistance states to change abruptly upon crossing 0 V, resulting in LRS-LRS memtransistors. Overall, the switching mechanism of both LRS-HRS and LRS-LRS memtransistors can be described by two memristors at the contacts connected by a field-effect transistor, as shown in FIG. 12E.

Figure 13B:
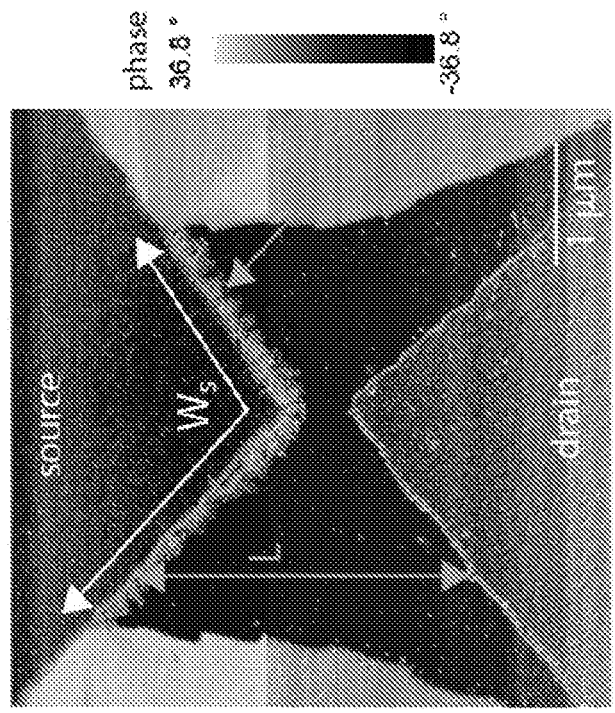
FIGS. 13A-13J show electromigration-induced degradation in control $MoS_2$ devices and memtransistors according to embodiments of the invention.
Figure 13A:
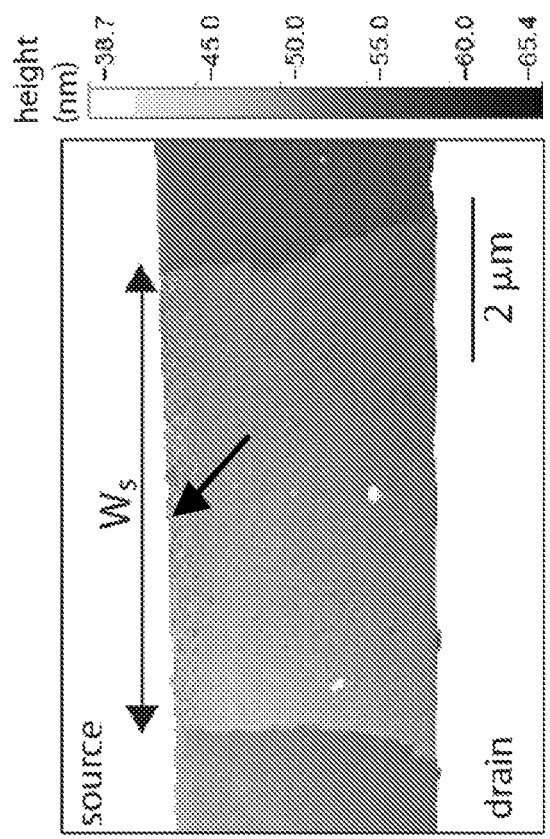
Figure 13C:
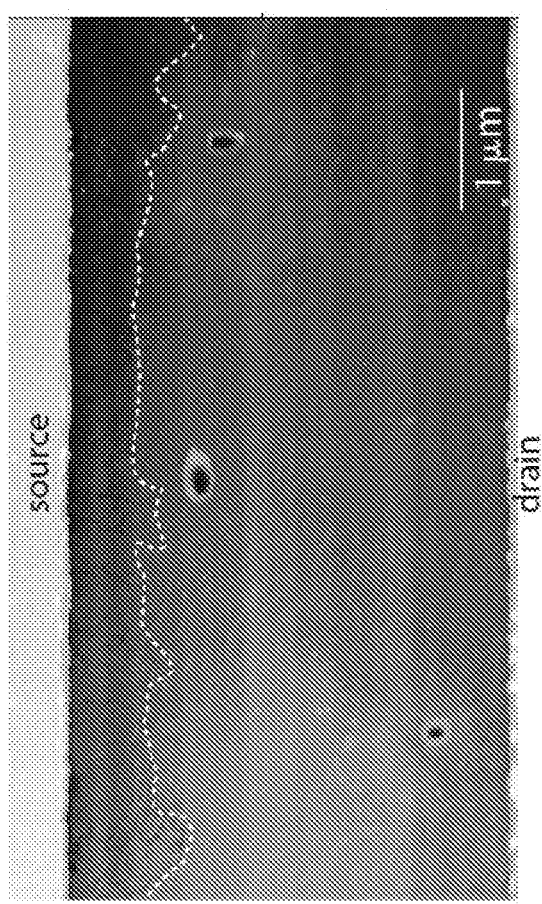
Figure 13D:
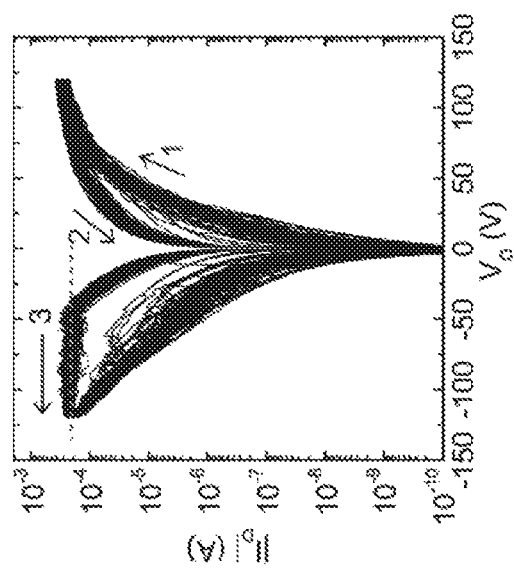
Figure 13E:
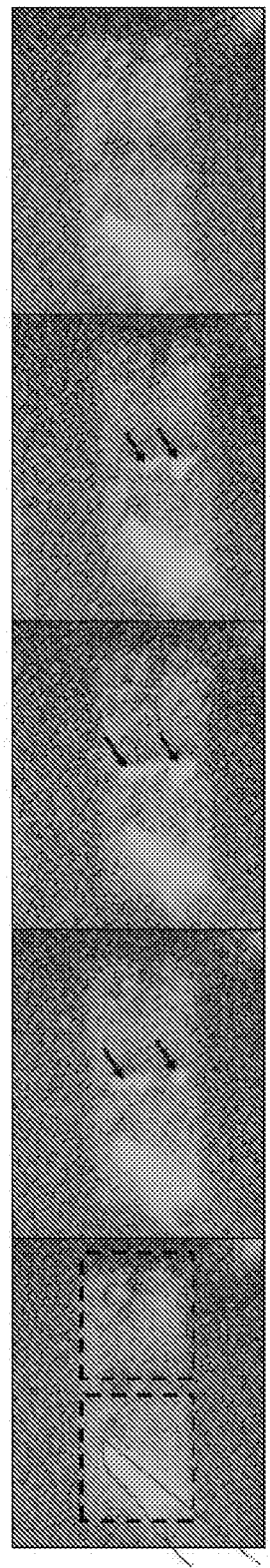
Figure 13H:
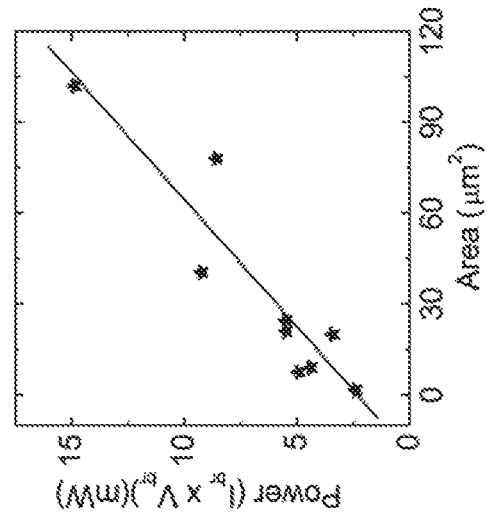
Figure 13G:
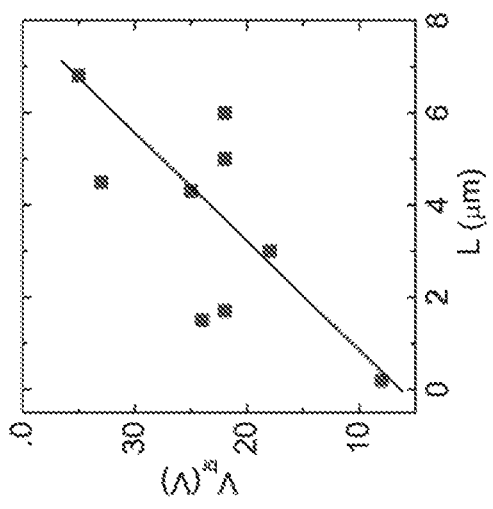
Figure 13F:
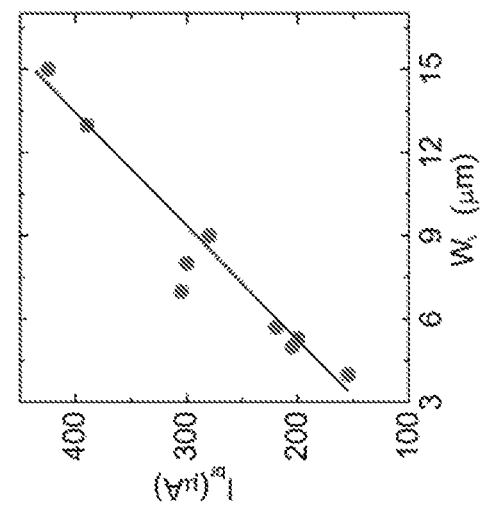
Figure 13J:
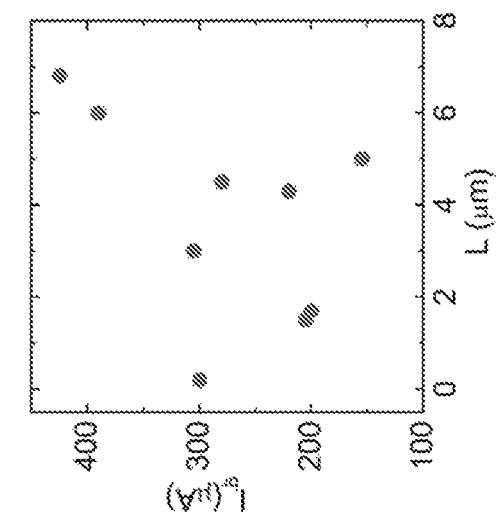
Figure 13I:
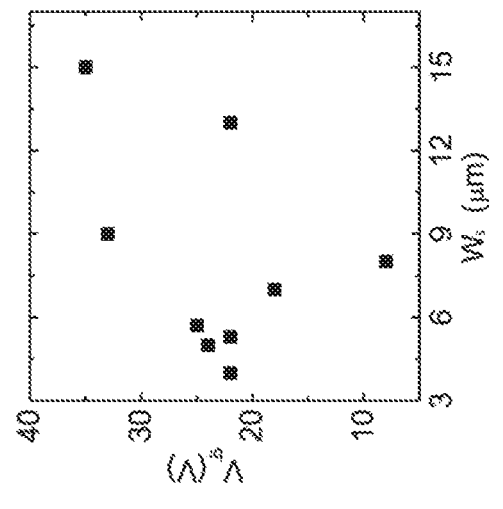

While grain boundaries in polycrystalline $MoS_2$ memtransistors enable large switching ratios and prevent electrical breakdown by lowering Schottky barriers through dynamic defect migration, control devices on single grains of CVD-grown $MoS_2$ show a qualitatively different reversible breakdown phenomenon, as shown in FIG. 4A. This breakdown event is marked by a sharp drop in the conductance at a voltage $V_{br}$ during sweep 1 that increases again to the original value during sweep 2. This abrupt change in charge transport is accompanied by the emergence of dendritic features (about 300-500 nm) close to the source, as shown in upper inset in FIG. 4A and in FIGS. 13A-13B. Control devices reveal a linear correlation of breakdown current ($I_{br}$) with the width of the source electrode ($W_{src}$) and no correlation with L, as shown in lower inset in FIG. 4A and in FIGS. 13F-13J. Since $I_D$ normally scales as W/L, the observed deviation in this scaling at breakdown suggests that the reverse-biased Schottky diode at the source electrode creates a bottleneck for electron injection at the channel [27], ultimately causing electromigration at the source contact [7]. This reversible breakdown in CVD $MoS_2$ contrasts the irreversible breakdown in exfoliated $MoS_2$ by Joule heating [29]. In the high bias limit (±120 V), polycrystalline $MoS_2$ memtransistors also degrade irreversibly in a manner that shows light emission during each subsequent sweep, as shown in FIGS. 13C-13E.

The 2D planar geometry of the $MoS_2$ memtransistor provides a platform to realize multi-terminal neural circuits mimicking multiple synaptic connections in neurons. For example, in a 6-terminal memtransistor, the conductance between any permutation of two of the four inner electrodes can be modulated by high-bias pulses applied to the outer two electrodes while the inner electrodes are kept floating, as shown in FIGS. 4B and 14A-14H. To achieve hetero synaptic plasticity, the conductance between pre-synaptic and post-synaptic neurons should be controlled by additional modulatory terminals [30]. While this type of modulation has been shown previously in Ag-based cationic memristors, this design is limited to only 3 terminals due to the requirement of filament formation across the channel [6, 30]. In contrast, the $MoS_2$ memtransistor enables larger numbers of terminals and facile tuning via modulation of the Schottky barrier localized at each terminal. Multi-terminal memtransistors also allow further tuning of heterosynaptic plasticity via a gate electrode where the switching ratio between any permutation of side electrodes can be controlled from about 2 to 10-fold by varying $V_G$ from 50 to 20 V, as shown in FIG. 14F.

The $MoS_2$ memtransistor also demonstrates long-term potentiation and long-term depression that mimic excitatory and inhibitory synapses in organisms, as shown in FIG. 4C. Post-synaptic current (PSC) is shown to increase and decrease exponentially with repetition of positive and negative bias pulses of 1 msec duration, as shown in FIG. 4C. The linearity of pulse training is comparable to metal-oxide memristors and can be further improved by employing bipolar pulsing schemes [11, 31]. Mimicking an indirect spike-timing dependent plasticity (STDP), paired pulses separated by a time interval ($\Delta t$) induce positive and negative changes in synaptic weight with positive and negative pulses, as shown in FIG. 4D, resulting in time constants of about 2 and 6 msec, respectively, which are comparable to biological synapse response times [11, 32].

According to the invention, the $MoS_2$ memtransistor combine resistive switching with transistor gating to realize nonlinear charge transport with wide tunability of individual states and switching ratios. In contrast to conventional devices that require single-crystal $MoS_2$ flakes, the utilization of polycrystalline and all-surface $MoS_2$ films allows straightforward scaling of this technology to large-area integrated circuits and post-growth defect engineering. The 2D planar geometry of monolayer $MoS_2$ further enables the realization of multi-terminal memtransistors with unprecedented heterosynaptic plasticity that holds promise for complex Hebbian learning from multiple inputs in neuromorphic computing by mimicking biological neurons with multiple synapses.

Fabrication and characterization of the $MoS_2$ memtransistor according to certain embodiments of the invention are described in detail as follows.

Chemical Vapor Deposition of $MoS_2$ Film

Polycrystalline monolayer $MoS_2$ with continuous film coverage was directly grown on oxidized Si substrates by chemical vapor deposition (CVD) using sulfur powder (Sigma-Aldrich) and molybdenum trioxide powder ($MoO_3$, 99.98% trace metal Sigma-Aldrich) following the recipe reported earlier [1, 2]. Prior to growth, Si substrates were bath-sonicated for about 10 min in acetone and isopropyl alcohol (IPA) and subsequently cleaned under $O_2$ plasma (Harrick Plasma) at about 200 mTorr for about 2 min with about 10.2 W power applied to the RF coil. The substrates were placed downstream in close proximity to about 12 mg of $MoO_3$ powder in an alumina boat in an about 1 inch diameter quartz tube furnace (Lindberg/Blue). About 150 mg of sulfur powder in an alumina boat was placed about 30 cm upstream of the $MoO_3$ boat (outside the furnace) and was heated independently using a temperature-controlled heating belt. The tube furnace was purged using ultrahigh purity Ar gas at about 200 sccm for about 10 min. Then, the pressure was increased to about 400 Torr, and the tube was evacuated to its base pressure of about 60 mTorr. The purging process was repeated twice to achieve an inert growth environment. The pressure was kept at about 150 Torr with an about 25 sccm flow of Ar gas during growth and cool down. Following the purge process, the furnace was heated to about 150° C. in about 5 min and held at that temperature for about 20 min to remove physisorbed contaminants from the growth environment. The furnace was then heated to about 800° C. at a rate of about 12° C./min and held at that temperature for 20 min, followed by natural cool down to room temperature. Concurrently, the heating belt around sulfur boat was first ramped to about 50° C. in about 5 min and was held at that temperature for 49 min. The heating belt was then brought to about 150° C. at a rate of about 4.5° C./min and held at that temperature for an additional about 23 min, after which it was allowed to cool down to room temperature naturally.

Chemical Characterization of Monolayer $MoS_2$ Film

Coverage and growth quality of continuous polycrystalline monolayer CVD $MoS_2$ on about 5 mm×5 mm substrates were characterized by optical microscopy, Raman microscopy, and photoluminescence (PL) spectroscopy. Raman spectra collected from a Horiba Scientific XploRA PLUS Raman microscope, as shown in FIG. 5A, show a peak spacing of about 19 $cm^{-1}$ between in-plane $A_{1g}$ and out-of-plane $E^1_{2g}$ breathing modes, thus confirming monolayer $MoS_2$ [3]. PL spectroscopy, as shown in FIG. 5B, shows a dominant exciton A at about 673 nm, typical of CVD-grown monolayer $MoS_2$ on $SiO_2$.

The chemical composition of CVD-grown polycrystalline monolayer $MoS_2$ films was confirmed by X-ray photoelectron spectroscopy (XPS) measurements using a Thermo Scientific ESCA Lab 250Xi scanning XPS connected with a monochromatic K-alpha Al X-ray line. The X-ray beam size was approximately 900 μm in diameter with an elliptical cross-section. A charge neutralization $Ar^+$ ion flood gun was also used to compensate for local electrostatic fields arising from charge build up in the $MoS_2/SiO_2$ samples. All XPS spectra were analyzed using Advantage software (Thermo Scientific). All Mo 3d subpeaks were fit using floating Gaussian-Lorentzian mixing and modified Shirley background subtraction. Fitting of Mo 3d subpeaks ensured that their full-width at half-maximum (FWHM) values were less than 3 eV, and doublets were also constrained to have the same FWHM. Charging effects were compensated in XPS spectra analyses by correcting all spectra against the C 1s adventitious carbon peak at 284.8 eV. As shown in FIGS. 5C-5D, the XPS spectra of the Mo 3d and S 2p orbitals are consistent with previous reports [4] of stoichiometric CVD $MoS_2$ with a minor amount of $MoO_x$ within the $MoS_2$ film [1].

Scanning Probe Microscopy

CVD $MoS_2$ films were characterized by atomic force microscopy (AFM) in ambient conditions using an Asylum Cypher AFM system in lateral force microscopy (LFM) mode and tapping mode. For LFM, NanoWorld FMR cantilevers with a resonant frequency of about 75 kHz and contact force of about 5 nN were used, as shown in FIG. 1C. The LFM retrace image was acquired by scanning the tip from right to left with a contact force of about 5 nN and scan rate of 1 Hz. For tapping mode, NanoWorld NCHR-W Si cantilevers (resonant frequency about 320 kHz) were used, as shown in FIGS. 5E-5F. A step height of 0.73 nm at the edge of a $MoS_2$ flake confirms monolayer thickness. AFM measurements of individual flake devices after electrical breakdown, as shown in upper inset in FIG. 4A and in FIGS. 13A-13J, were conducted in tapping mode using a Bruker Dimension FastScan® AFM. Electrostatic force microscopy (EFM) of $MoS_2$ memtransistors was conducted in ambient conditions using the environment cell of the Asylum Cypher AFM system using NanoWorld PointProbe EFM tips coated with Par (resonant frequency of about 75 kHz).

Fabrication of $MoS_2$ Memtransistors $MoS_2$ LRS-HRS memtransistors were fabricated following a photolithography process developed to minimize processing residues. First, a film of polymethylglutarimide (PMGI) was spin-coated on $SiO_2$/Si substrates covered by polycrystalline monolayer $MoS_2$ at about 4500 rpm for about 45 sec followed by a baking step for about 10 min at about 170° C. using a hot plate. Note that the baking conditions for the PMGI layer were found to be critical. Lower temperature (about 160° C.) resulted in delamination during development while higher temperature (about 180° C.) made it difficult to remove PMGI during the lift-off step. Afterwards, a thin film of photoresist (S1813, Shipley Company) was spin-coated at about 4000 rpm for about 1 min followed by another pre-baking step at about 115° C. for about 1 min. The bilayer resist was exposed to UV light (about 365 nm) for about 15 sec and then developed in MF319 developer (Shipley Company) for about 20 sec without further post-baking. The samples were rinsed with DI water and thoroughly dried before subjecting them to reactive ion etching to pattern the exposed $MoS_2$ film. The $MoS_2$ film was etched using Ar at power of about 50 W, pressure of about 100 mTorr, and flow rate of about 50 sccm for about 20 sec. Subsequently, the bilayer resist mask was removed by submerging the substrate overnight in an N-Methyl-2-pyrrolidone (NMP) bath heated at about 80° C. At this stage, the patterned $MoS_2$ strips resemble the optical image shown in FIG. 1E. Finally, source-drain electrodes were fabricated by patterning a negative photoresist NR9-1000PY (Futurrex, Inc.) followed by thermal evaporation of metals (about 3 nm Ti/50 nm Au) and lift-off in NMP. $MoS_2$ LRS-LRS memtransistors were fabricated using the same recipe except that no PMGI layer was used.

Electrical Measurements

All room temperature electrical measurements were carried in a vacuum probe station at a pressure of about $5 \times 10^{-5}$ Torr in dark using a LakeShore CRX 4K probe station. Endurance, retention, and neural learning tests were conducted in vacuum using Pulse Measure Units in a Keithley 4200A-SCS Parameter Analyzer and home-developed LabVIEW programs. For variable temperature transport measurements, the devices were first switched to HRS and $I_D$-$V_G$ characteristics were collected at $V_D$=0.1 V from about 300 K to about 75 K at a step of about 25 K. A pressure of about $8 \times 10^{-7}$ Torr was achieved during cryogenic measurements using a built-in cryopump. The devices were allowed to heat up to room temperature overnight and then switched to LRS at room temperature followed by similar variable temperature transport measurements in LRS. In the sub-threshold regime, the charge transport in Schottky barrier field-effect transistors is dominated by thermionic emission [5, 6]:

$$I_D = A^* \cdot T^{\frac{3}{2}} \exp\left(\frac{\phi_b}{kT}\right)\left[\exp\left(\frac{eV_D}{kT}\right) - 1\right] \quad (4)$$

where $A^*$, k, e, T, and $\phi_b$ are the 2D equivalent Richardson constant, the Boltzmann constant, electronic charge, temperature, and Schottky barrier height, respectively. The term $T^{3/2}$ comes from the 2D model (as opposed to $T^2$ in 3D). At low bias, we can neglect $V_D$ and extract $\phi_b$ from $\ln(I/T^{3/2})$ versus $1/T$ at different $V_G$, as shown in FIGS. 10A-10D.

Modeling the MoS$_2$ Memtransistor

We model the memtransistor behavior by integrating a mathematical formalism of memristive systems [7-10] and memory transistors (memtransistors) [11] with the charge transport model of a Schottky barrier field-effect transistor (SB-FET) [5, 12-16]. Memristive systems are defined as:

$$\frac{dw}{dt} = f(w, v, t), \quad (5)$$
$$I = g(w, v, t) \cdot v$$

where t is time, and v and I are the input and output of the system, respectively; w is an internal state variable represented by a n-dimensional vector; g is a continuous scalar function; while f is a continuous n-dimensional vector function. Note that lower case symbols are used throughout this section to enhance clarity. Subsequently, a voltage-controlled memtransistor is defined [11] as $$\frac{dw}{dt} = f(w, v_g, v_d), \quad (6)$$
$$i_d = g(w, v_g, v_d),$$
$$i_g = h(w, v_g, v_d),$$

where $v_d$ and $v_g$ are input drain and gate voltages, and $i_d$ and $i_g$ are measured drain and gate currents; g and h are scalar functions whereas f is a n-dimensional vector determined by the dimension of the vector state variable w. The dependence on time t is implicit through the voltage sweep rates. In $1^{st}$ order memristors, w is a scalar and is usually defined by the physical region of devices including higher concentration of charged dopants or vacancies. Similarly, floating gate metal-oxide-semiconductor field-effect transistors (MOSFETs) [17] and nanoionic dielectric gated FETs [18] have also been treated as $1^{st}$ order memtransistors where f is a scalable function [11].

In the present MoS$_2$ memtransistors, EFM and cryogenic transport measurements show strong evidence of dynamic variation in Schottky barrier height. Indeed, Schottky barrier modulation is the underlying mechanism of interface-based switching in transition-metal oxide and ferroelectric memristors where local segregation of mobile dopants varies the tunneling barrier dynamically [19-25]. Tuning the Schottky barrier by ion-implantation (i.e., local density of dopants) is central to the contact engineering in FETs [5, 12-14]. Based on these observations, we hypothesize that the local redistribution of dopants in polycrystalline MoS$_2$, facilitated by grain boundaries, is the main cause of barrier modulation. Varying the density of dopants ($n_1$) in the region w from the contact edge, as shown in FIG. 13A, changes the maximum electric field $\xi_m$ (and effective Schottky barrier height $\Delta\phi_{image1}$) by virtue of image charge lowering [5] as $$|\xi_m| = \frac{e}{\varepsilon_s}(n_1 w - n(d - w)) \approx \frac{e n_1 w}{\varepsilon_s} \quad (7)$$

$$\Delta\phi_{image1} \approx \frac{e}{\varepsilon_s}\sqrt{\frac{n_1 w}{4\pi}} \quad (8)$$

where e is electronic charge, and $\varepsilon_s$ is dielectric constant of the semiconductor. In the case of a 2D semiconductor, the metal image plane is cut by half, and thus the equation for a bulk semiconductor changes only by a factor of 2 that is neglected here since $n_1$ is a fitting parameter. However, image charge lowering also depends on drain bias $v_d$ and gate bias $v_g$ and cannot be neglected at large biases. As shown previously [5, 15, 16], the easiest way to incorporate the high bias scenario is through geometrical factors A and B, resulting in $$\Delta\phi_{image2} = \sqrt{\frac{e\xi_m}{4\pi\varepsilon_s}} = \sqrt{\frac{e}{4\pi\varepsilon_s}}\left[\sqrt{\frac{B(v_g - v_{th})}{t_{ox}}} + \sqrt[4]{\frac{2en(\phi_{b0} + Av_d)}{\varepsilon_s}}\right] \quad (9)$$

where $v_{th}$ is threshold voltage and $t_{ox}$ is thickness of oxide dielectric. Furthermore, at high biases tunneling cannot be neglected and its essential feature can be captured in the following expression [15]:

$$\Delta\phi_{tunnel} = \frac{1}{e}\left(\frac{3e\hbar(\ln 2)}{4\sqrt{2m^*}}\right)^{2/3}\left(\frac{B(v_g - v_{th})}{t_{ox}}\right)^{2/3} \quad (10)$$

where $m^*$ is the effective mass and $\hbar$ is the Planck constant. The net effective barrier height ($\Delta\phi$) can be obtained by adding equations (8)-(10) to obtain $$\Delta\phi = \Delta\phi_{image1} + \Delta\phi_{image2} + \Delta\phi_{tunnel} \quad (11)$$

$$\Delta\phi = \frac{e}{\varepsilon_s}\sqrt{\frac{n_1 w}{4\pi}} + \sqrt{\frac{e}{4\pi\varepsilon_s}}\left[\sqrt{\frac{B(v_g - v_{th})}{t_{ox}}} + \sqrt[4]{\frac{2en(\phi_{b0} + Av_d)}{\varepsilon_s}} + \frac{1}{e}\left(\frac{3e\hbar(\ln 2)}{4\sqrt{2m^*}}\right)^{2/3}\left(\frac{B(v_g - v_{th})}{t_{ox}}\right)^{2/3}\right]. \quad (12)$$

A dynamically varying barrier changes the transistor $i_d$-$v_d$ characteristics to yield a pinched hysteresis loop. Since memristive switching ratio is largest in the sub-threshold regime, as shown in FIG. 2B, we take the following expression for $i_d$-$v_d$ characteristics for SB-FETs [26]:

$$i_d = D\,\exp\left(\frac{e(v_g - v_{th})}{c_r.kT}\right)\left(1 - \exp\left(-\frac{ev_d}{kT}\right)\right) \quad (13)$$

where the first exponential term gives a straight line in log-linear plot of $i_d$-$v_g$ characteristics, as shown in FIG. 2C, and the corresponding (sub-threshold) slope is given by $$2.3\frac{kT}{e}c_r.$$

The second exponential term is responsible for the large asymmetry observed in high-bias characteristics, as shown in FIG. 2A. The second term becomes negligible for $v_d>3$ kT, and thus forward bias characteristics saturate quickly with $v_d$, as shown in FIG. 2B. Since the variable temperature conductivity fits well to the thermionic emission model, as shown in FIG. 3C, in the sub-threshold regime ($v_g<v_{th}$), we obtain the voltage-controlled memtransistor equation by multiplying equation (10) with a barrier height term in the thermionic equation (4):

$$i_d = D\,\exp\left(\frac{e(v_g - v_{th})}{c_r.kT}\right)\left(1 - \exp\left(-\frac{ev_d}{kT}\right)\right)\exp\left(\frac{\phi_b(w)}{kT}\right) \quad (14)$$

For $v_d>0$ V, the Schottky diode at the source is reverse biased and acts as bottleneck for device current, whereas, for $v_d<0$ V, the Schottky diode at the drain is reverse biased. Therefore, dopant redistribution at the two different contacts dominates in the positive and negative bias regimes, allowing the device to be visualized as two memristors connected by a transistor, as shown in FIG. 12E. Local electrostatics at the two contacts is inherently asymmetric at large positive and large negative $v_d$ values because $v_g$-$v_s<0$ V at the source for $v_d>0$ V (note, $v_s=0$ V); while, $v_g$-$v_d>0$ V at the drain for $v_d<0$ V in the most relevant regime of $v_g<0$ V and $|v_d|>|v_g|$. In other words, the $MoS_2$ Fermi level is deeper into the band gap at the source in forward bias than that at the drain in reverse bias. Since both $v_d$ and $v_g$ dictate Schottky barrier modulation, we need two different sets of equations for source and drain in forward and reverse biases, respectively. Neglecting gate leakage current $i_g$, as shown in FIG. 7A, we modify equation (6) to get the following equation (15), where the only differences between functions f and g, and between h and i, are the fitting parameters. $w_d$ and $w_s$ are state variables at the drain and source contacts, respectively.

$$\frac{\partial w_d}{\partial t} = f(w_d, v_d, v_g, t), \quad (15)$$

$$\frac{\partial w_s}{\partial t} = g(w_s, v_d, v_g, t),$$

$$i_d = \begin{cases} h(w_s, v_d, v_g, t) & \text{for } v_d \geq 0 \\ i(w_d, v_d, v_g, t) & \text{for } v_d < 0 \end{cases}$$

$$i_g = 0$$

Dynamic redistribution of dopants under bias is usually governed by drift motion. Consequently, physical models of memristors often require a non-linear drift with field to keep the state variable w within the boundary conditions. Dopant drift is significantly suppressed as it approaches the device dimension on either side, thereby avoiding irreversible hard switching or breakdown. Non-linearity of dopant drift is usually modeled by a window function F(w), and thus we obtain [10]:

$$\frac{\partial w}{\partial t} = \frac{\mu R_{on} i(t)}{D^2}F(w) \quad (17)$$

where D is the distance between the two electrodes, $\mu$ is the mobility of dopant, and $R_{on}$ is the resistance of the device when w spans the whole distance D. The window function [27]

$$F(w) = 1 - [(w - 0.5)^2 + 0.75]^p \quad (18)$$

has reproduced bipolar resistive switching in a wide range of metal-oxide memristors. It should be noted that larger p values imply larger non-linearity. Thus, we combine equations (12), (14), (15), and (17) to get the following set of equations for $v_d>0$ V:

$$i_d = D\,\exp\left(\frac{e(v_g - v_{th})}{c_r.kT}\right)\left(1 - \exp\left(-\frac{e|v_d|}{c_{vd}.kT}\right)\right) \quad (18)$$

$$\exp\left(\frac{\phi_{b0} - \frac{e}{\varepsilon_s}\sqrt{\frac{n_1 w_d}{4\pi}} + \sqrt{\frac{e}{4\pi\varepsilon_s}}\sqrt[4]{\frac{2en(\phi_{b0} + A|v_d|)}{\varepsilon_s}}}{kT}\right)$$

$$\frac{\partial w_d}{\partial t} = E.i_d(1 - [(w_d - 0.5)^2 + 0.75]^p) \quad (19)$$

$$v_d = \begin{cases} 5t & \text{for } t = 0\text{-}16\ s \\ 80 - 5(t - 16) & \text{for } t = 16\text{-}32\ s \end{cases} \quad (20)$$

where equation (20) is the drain bias sweep and A, D, E and $n_1$ are fitting parameters. The geometrical factor $c_{vd}$ plays a similar role as $c_r$ and limits exponentially growing current at high negative biases. Here, we first focus on fitting $i_d$-$v_d$ characteristics for a fixed $v_g$; therefore, the terms involving geometrical factor B in equation (12) are absorbed in the fitting parameter D. Similarity the following set of equations describes the memtransistor behavior for $v_d<0$ V, $$i_d = D'\,\exp\left(\frac{e(v_g - v_{th})}{c_r.kT}\right)\left(1 - \exp\left(-\frac{e|v_d|}{c_{vd}.kT}\right)\right) \quad (21)$$

$$\exp\left(\frac{\phi'_{b0} - \frac{e}{\varepsilon_s}\sqrt{\frac{n_1 w_d}{4\pi}} + \sqrt{\frac{e}{4\pi\varepsilon_s}}\sqrt[4]{\frac{2en(\phi_{b0} + A|v_d|)}{\varepsilon_s}}}{kT}\right)$$

$$\frac{\partial w_s}{\partial t} = E'.i_d(1 - [(w_s - 0.5)^2 + 0.75]^p) \quad (22)$$

-continued $$v_d = \begin{cases} -5(t-32) & \text{for } t = 32\text{-}48 \ s \\ -80 + 5(t-48) & \text{for } t = 48\text{-}64 \ s \end{cases} \quad (23)$$

where a different set of fitting parameters, A', D', and E' are needed due to asymmetric electrostatics and dopant kinetics.

The experimental memtransistor characteristics are fit well with this model, as shown in FIG. 2A, FIGS. 11B-11C show dynamic modulation of $w_d$ and $w_s$ with $v_d$. Experimental values of $c_r=83.3$ and $v_{th}=20$ V were used in addition to the constant $\phi_{b0}=385$ meV and $\varepsilon_s=4$ for monolayer $MoS_2$ [28]. The fitting parameters in FIG. 2A are $A=10^{-5}$, $D=5.5 \times 10^{-9}$, and $E=7 \times 10^4$. Note that although we treated w and $n_1$ independently in the mathematical formalism, we cannot measure them independently. Thus, we treat the product ($n_1 \cdot w$) as an internal state variable. For the fitting in FIG. 2A, we get $n_1 \cdot w_s < 10^{10}$ cm$^{-2}$ and $n_1 \cdot w_s < 3.5 \times 10^9$ cm$^{-2}$ in order to get Schottky barrier heights covering the entire range of the experimental values (80-125 meV) shown in FIG. 3C ($n_1$ in the model has units of cm$^{-3}$). Fitting in FIG. 2A results in effective Schottky barrier heights ranging from 20 meV to 280 meV in LRS and HRS, respectively. Thus, overestimation of the simulated values in HRS and underestimation in LRS could result from non-idealities in the transistor transport model at high biases. Assuming w of order of a few nanometers, we get a maximum excess doping $n_1$ about $10^{10}$ cm$^{-2}$ that is within the range of measured doping from $MoS_2$ defects [4].

The smaller value of $n_1 \cdot w_d$ compared to $n_1 \cdot w_s$ results from smaller fields at the drain for $v_d<0$ V than that at source for $v_d>0$ V, consistent with the smaller hysteretic loop in reverse bias. Note that although the net device current ($i_d$) is determined by $w_s$ for $v_d>0$ V and by $w_d$ for $v_d<0$ V, $w_d$ ($w_s$) must return to its initial value during $v_d>0$ V ($v_d<0$ V) for reversible behavior. Achieving this behavior is trivial by setting appropriate fitting parameters D, E (D', E'). In real devices, a large electric field is also expected near forward biased Schottky diodes and redistribution of dopants to the initial configuration is expected. Finally, by considering the first exponential term consisting of $v_g$, we can simulate the gate-tunability of memtransistor characteristics consistent with the observed experimental behavior, as shown in FIGS. 11D-11E. Deviations between simulations and experiments become larger at larger $v_g$ values due to the decreased validity of the SB-FET model beyond the sub-threshold regime.

Switching Mechanism

Figure 3D:
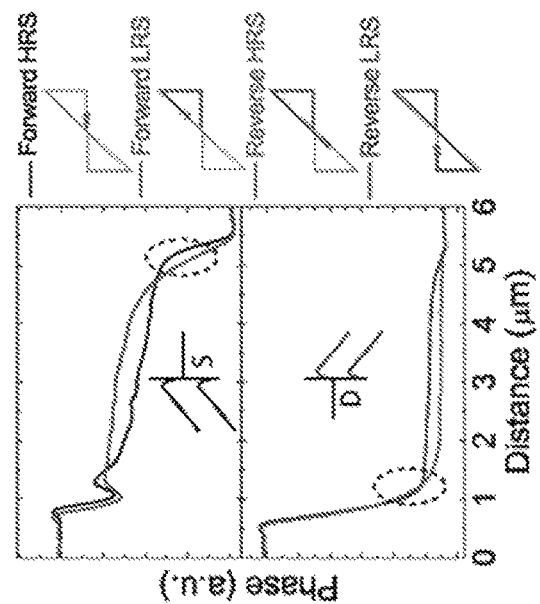
Figure 3E:
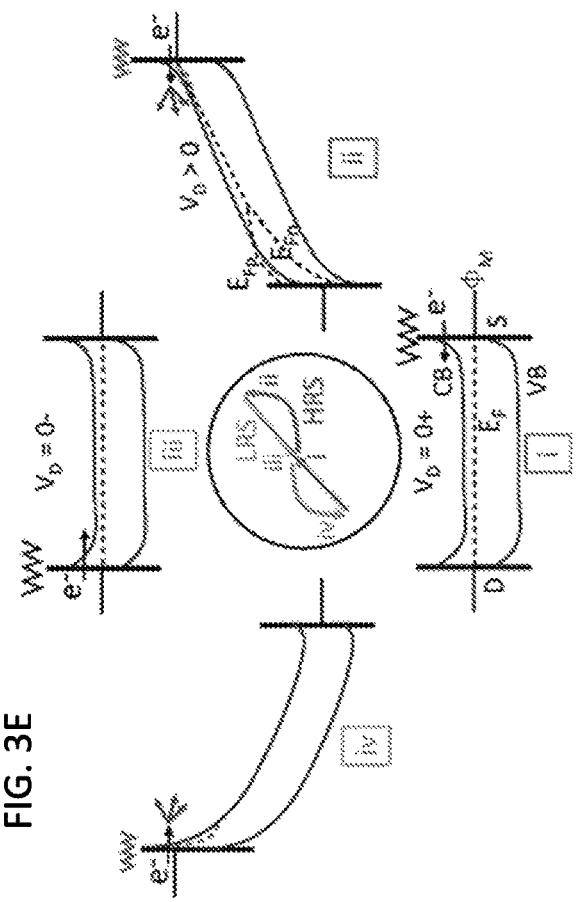
Figure 6A:
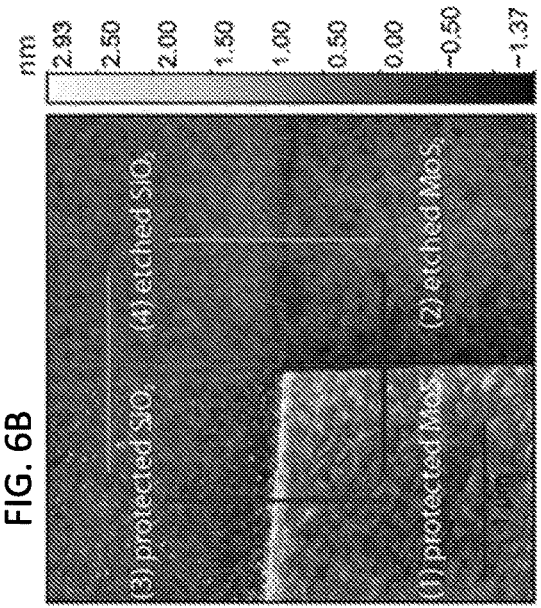
FIGS. 6A-6D show AFM analysis of a residue-free photolithography process according to embodiments of the invention.
Figure 6B:
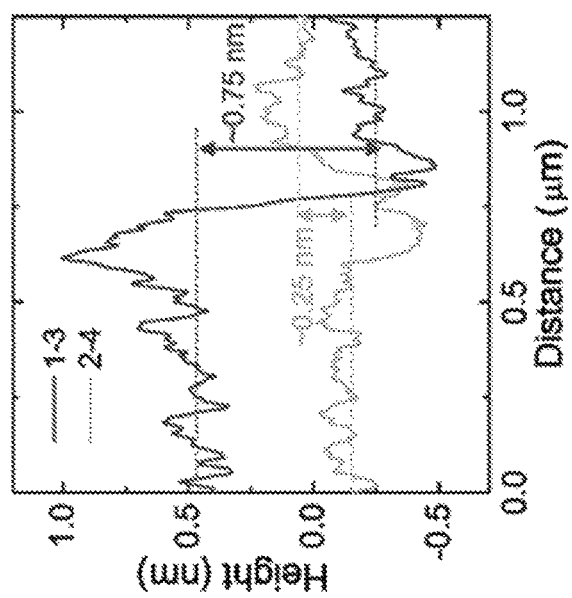
Figure 6C:
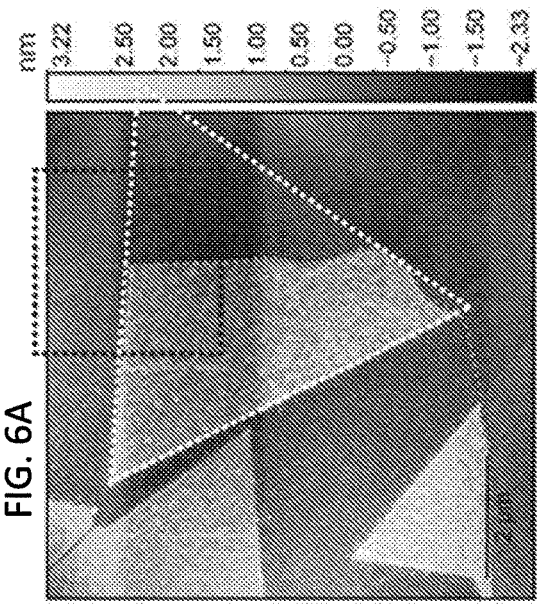
Figure 6D:
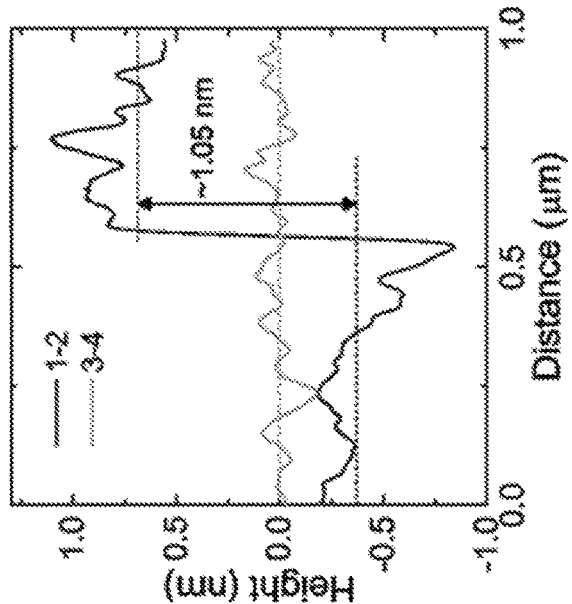

The switching mechanism of $MoS_2$ memtransistors can be understood by assuming two memristors at the source (S-memristor) and the drain (D-memristor) that are connected by a FET, as shown in FIG. 12E. Note that the gate-tunable resistive switching cannot be obtained by simply connecting two conventional memristors with a transistor. The Schottky barrier height modulation is intimately connected to the operation of the SB-FET in the $MoS_2$ memtransistor. Thus, this distinction of memristor and transistor only serves to clarify the switching mechanism. $MoS_2$ memtransistors with residue-free interfaces between the metal and $MoS_2$, as shown in FIGS. 2A-2F, undergo HRS to LRS switching at positive bias and from LRS to HRS in negative bias and are called "LRS-HRS" memtransistors here. $MoS_2$ memtransistors with about 1.5 nm polymer tunnel barrier between metal and $MoS_2$, as shown in FIGS. 12A-12D, undergo similar HRS to LRS switching at both positive and negative biases and are called "LRS-LRS"

memtransistors. The main difference is that the LRS-HRS memtransistor retains its state while crossing over 0 V, whereas LRS-LRS memtransistors undergo switching while crossing over 0 V, as shown in FIGS. 2B and 3D. Both of the contrasting behaviors can be explained by the resistance table shown in FIG. 12E. HD and LD are the resistance values of HRS and LRS of the D-memristor, whereas HS and LS are the resistance values of HRS and LRS of the S-memristor. We have HD>>LD and HS>>LS for both kinds of memtransistors, and their relative amplitudes determine the switching ratio. LD' and LS' are intermediate states whose values differ vastly between LRS-HRS and LRS-LRS memtransistors.

For LRS-HRS memtransistors, switching events A and B dominate while the switching event C is negligible, as shown in FIG. 12E. Switching A occurs at the bottleneck contact (i.e., the source for forward bias and the drain for reverse bias) while switching B occurs at the other contact in order to restore the dopant distribution at the end of a full sweep cycle. This condition is necessitated by bipolar resistive switching, and its physical origin is well-explained by the memtransistor model. Thus, intermediate states LD' and LS' have values close to LD and LS, respectively.

On other hand, for LRS-LRS memtransistors, all switching events A, B, and C dominate. The resist layer acts at a tunnel barrier and de-pins the Fermi level of $MoS_2$. Similar Fermi level de-pinning and has been shown in $MoS_2$ by employing ultrathin tunnel barriers such as 2 nm MgO [6], 1 nm $TiO_2$ [29], 1.5 nm $Ta_2O_5$ [30], and 0.6 nm hexagonal boron nitride [31], resulting in reduction of the effective Schottky barrier height ($\Delta \phi_b$) from 100 meV to 23 meV, from 121 meV to 27 meV, from 95 meV to 29 meV, and from 159 meV to 31 meV, respectively. Introduction of the tunnel barrier significantly increases the thermionic emission contribution to the total current, outweighing the additional tunnel resistance. Here, a about 1.5 nm thick tunnel barrier of the polymer resist makes the resistances of reverse-biased Schottky diodes at the source ($V_D>0$ V) and drain ($V_D<0$ V) more symmetric, resulting in more symmetric $I_D$-$V_D$ compared to LRS-HRS memtransistors, as shown in FIGS. 2B and 3D. This switching involves a dynamic negative differential resistance feature for $V_D<0$ V common in memristors, as shown in FIG. 3D, [25]. This phenomena increases the resistance of the intermediate states LD' and LS' such that LD'>>LD, LS'>>LS. In other words, the switching B in FIG. 12E cannot be neglected, explaining the full switching cycles of LRS-LRS memtransistors. Compared to LRS-HRS memtransistors, LRS-LRS memtransistors show higher conductivity at the same $V_D$ bias and switch at smaller $V_G$ bias. This behavior can be explained by the smaller contact resistance from the de-pinned Fermi level and/or increased doping from the residue layer.

Comprehensive understanding of the LRS-HRS memtransistor also sheds light on the operating mechanism of the heterosynaptic multi-terminal devices, as shown in FIG. 4B. Conductance changes between the side electrodes 1-4 upon high bias pulses between the main electrodes 5 and 6 occurs due to modulation of the Schottky barrier near the side electrodes. Switching ratios were observed to increase with overlap areas of the side electrode with the $MoS_2$. Thus, floating electrodes pin the Fermi level of $MoS_2$, and the energy level of $MoS_2$ under the side electrodes is lower than the $MoS_2$ region outside the side electrodes, as shown in FIGS. 14G-14H, resulting in additional band-bending in the channel. Dopants are expected to redistribute near the floating electrodes in the same manner as LRS-HRS memtransistors during sweeps 2 and 4, as shown in FIG. 2A.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Strukov, D. B., Snider, G. S., Stewart, D. R. & Williams, R. S. The missing memristor found. *Nature* 453, 80-83 (2008).

[2]. Yang, J. J. et al. Memristive switching mechanism for metal/oxide/metal nanodevices. *Nat. Nanotechnol.* 3, 429-433 (2008).

[3]. Duygu, K., Shimeng, Y. & Wong, H. S. P. Synaptic electronics: materials, devices and applications. *Nanotechnology* 24, 382001 (2013).

[4]. Yu, S. & Chen, P. Y. Emerging memory technologies: Recent trends and prospects. *IEEE Sol. Stat. Circuit Mag.* 8, 43-56 (2016).

[5]. Yang, J. J., Strukov, D. B. & Stewart, D. R. Memristive devices for computing. *Nat. Nanotechnol.* 8, 13-24 (2013).

[6]. Waser, R., Dittmann, R., Staikov, G. & Szot, K. Redox-based resistive switching memories—Nanoionic mechanisms, prospects, and challenges. *Adv. Mater.* 21, 2632-2663 (2009).

[7]. Pershin, Y. V. & Di Ventra, M. Memory effects in complex materials and nanoscale systems. *Adv. Phys.* 60, 145-227 (2011).

[8]. Wong, H. S. P., et al. Metal-oxide RRAM. *Proc. IEEE* 100, 1951-1970 (2012).

[9]. Andy, T. Memristor-based neural networks. *J. Phys. D: Appl. Phys.* 46, 093001 (2013).

[10]. Giacomo, I. et al. Integration of nanoscale memristor synapses in neuromorphic computing architectures. *Nanotechnology* 24, 384010 (2013).

[11]. Jo, S. H. et al. Nanoscale memristor device as synapse in neuromorphic systems. *Nano Lett.* 10, 1297-1301 (2010).

[12]. Kim, S. et al. Pattern recognition using carbon nanotube synaptic transistors with an adjustable weight update protocol. *ACS Nano* 11, 2814-2822 (2017).

[13]. Kim, S. et al. Experimental demonstration of a second-order memristor and its ability to biorealistically implement synaptic plasticity. *Nano Lett.* 15, 2203-2211 (2015).

[14]. Widrow, B. An adaptive adaline neuron using chemical memistors. *Stanford Electronics Laboratories Technical Report* 1553-2 (1960).

[15]. Lai, Q. et al. Ionic/electronic hybrid materials integrated in a synaptic transistor with signal processing and learning functions. *Adv. Mater.* 22, 2448-2453 (2010).

[16]. Diorio, C., Hasler, P., Minch, A. & Mead, C. A. A single-transistor silicon synapse. *IEEE Trans. Electron Dev.* 43, 1972-1980 (1996).

[17]. Mouttet, B. Memristive systems analysis of 3-terminal devices. *IEEE Inter. Conf. Electron., Circuits & Systems* 930-933 (2010).

[18]. Azizi, A. et al. Dislocation motion and grain boundary migration in two-dimensional tungsten disulphide. *Nat. Commun.* 5, 4867 (2014).

[19]. Komsa, H.-P. et al. From point to extended defects in two-dimensional $MoS_2$: Evolution of atomic structure under electron irradiation. *Phys. Rev. B* 88, 035301 (2013).

[20]. Sangwan, V. K. et al. Gate-tunable memristive phenomena mediated by grain boundaries in single-layer $MoS_2$. *Nat. Nanotechnol.* 10, 403-406 (2015).

[21]. Yu, Z. G., Zhang, Y.-W. & Yakobson, B. I. An anomalous formation pathway for dislocation-sulfur vacancy complexes in polycrystalline monolayer $MoS_2$. *Nano Lett.* 15, 6855-6861 (2015).

[22]. Bessonov, A. A. et al. Layered memristive and memcapacitive switches for printable electronics. *Nat. Mater.* 14, 199-204 (2015).

[23]. He, G. et al. Thermally assisted nonvolatile memory in monolayer $MoS_2$ transistors. *Nano Lett.* 16, 6445-6451 (2016).

[24]. Arnold, A. J. et al. Mimicking neurotransmitter release in chemical synapses via hysteresis engineering in $MoS_2$ transistors. *ACS Nano* 11, 3110-3118 (2017).

[25]. Chua, L. Resistance switching memories are memristors. *Appl. Phys. A* 102, 765-783 (2011).

[26]. Shannon, J. M. Control of Schottky barrier height using highly doped surface layers. *Sol. Stat. Electron.* 19, 537-543 (1976).

[27]. Sze, S. M. & Ng, K. K. *Physics of Semiconductor Devices*. Wiley-Interscience, 2006.

[28]. Prodromakis, T., Peh, B. P., Papavassiliou, C. & Toumazou, C. A versatile memristor model with nonlinear dopant kinetics. *IEEE Trans. Electron Dev.* 58, 3099-3105 (2011).

[29]. Lembke, D. & Kis, A. Breakdown of high-performance monolayer $MoS_2$ transistors. *ACS Nano* 6, 10070-10075 (2012).

[30]. Yang, Y., Chen, B. & Lu, W. D. Memristive physically evolving networks enabling the emulation of heterosynaptic plasticity. *Adv. Mater.* 27, 7720-7727 (2015).

[31]. Wang, I. T. et al. 3D $Ta/TaO_x/TiO_2/Ti$ synaptic array and linearity tuning of weight update for hardware neural network applications. *Nanotechnology* 27, 365204 (2016).

[32]. Bi, G.-Q. & Poo, M.-M. Synaptic modifications in cultured hippocampal neurons: Dependence on spike timing, synaptic strength, and postsynaptic cell type. *J. Neurosci.* 18, 10464-10472 (1998).

[33]. Shastry, T. A. et al. Mutual photoluminescence quenching and photovoltaic effect in large-area single-layer $MoS_2$-polymer heterojunctions. *ACS Nano* 10, 10573-10579 (2016).

[34]. Liu, X. et al. Rotationally commensurate growth of $MoS_2$ on epitaxial graphene. *ACS Nano* 10, 1067-1075 (2016).

[35]. Lee, C. et al. Anomalous lattice vibrations of single- and few-layer $MoS_2$. *ACS Nano* 4, 2695-2700 (2010).

[36]. Kim, I. S. et al. Influence of stoichiometry on the optical and electrical properties of chemical vapor deposition derived $MoS_2$. *ACS Nano* 8, 10551-10558 (2014).

[37]. Sze, S. M. & Ng, K. K. *Physics of Semiconductor Devices*. Wiley-Interscience, 2006.

[38]. Chen, J.-R. et al. Control of Schottky barriers in single layer MoS₂ transistors with ferromagnetic contacts. *Nano Lett.* 13, 3106-3110 (2013).

[39]. Chua, L. Memristor-the missing circuit element. *IEEE Transactions on Circuit Theory* 18, 507-519 (1971).

[40]. Chua, L. Resistance switching memories are memristors. *Appl. Phys. A* 102, 765-783 (2011).

[41]. Chua, L. O. & Sung Mo, K. Memristive devices and systems. *Proc. IEEE* 64, 209-223 (1976).

[42]. Strukov, D. B., Snider, G. S., Stewart, D. R. & Williams, R. S. The missing memristor found. *Nature* 453, 80-83 (2008).

[43]. Mouttet, B. Memristive systems analysis of 3-terminal devices. *IEEE Inter. Conf. Electron., Circuits & Systems* 930-933 (2010).

[44]. Shannon, J. M. Control of Schottky barrier height using highly doped surface layers. *Sol. Stat. Electron.* 19, 537-543 (1976).

[45]. Shannon, J. M. Reducing the effective height of a Schottky barrier using low-energy ion implantation. *Appl. Phys. Lett.* 24, 369-371 (1974).

[46]. Shannon, J. M. Increasing the effective height of a Schottky barrier using low-energy ion implantation. *Appl. Phys. Lett.* 25, 75-77 (1974).

[47]. Kedzierski, J., et al. Complementary silicide source/drain thin-body MOSFETs for the 20 nm gate length regime. *International Electron Devices Meeting* 2000. *Technical Digest. IEDM* (Cat. No. 00CH37138) 57-60 (2000).

[48]. Calvet, L. E. Electrical transport in Schottky barrier MOSFETs. PhD thesis, Yale, 2001.

[49]. Diorio, C., Hasler, P., Minch, A. & Mead, C. A. A single-transistor silicon synapse. *IEEE Trans. Electron Dev.* 43, 1972-1980 (1996).

[50]. Lai, Q. et al. Ionic/electronic hybrid materials integrated in a synaptic transistor with signal processing and learning functions. *Adv. Mater.* 22, 2448-2453 (2010).

[51]. Sawa, A. Resistive switching in transition metal oxides. *Mater. Today* 11, 28-36 (2008).

[52]. Kubicek, M., Schmitt, R., Messerschmitt, F. & Rupp, J. L. M. Uncovering two competing switching mechanisms for epitaxial and ultrathin strontium titanate-based resistive switching bits. *ACS Nano*9, 10737-10748 (2015).

[53]. Lee, H.-S. et al. Ferroelectric tunnel junction for dense cross-point arrays. *ACS Appl. Mater. Interfaces* 7, 22348-22354 (2015).

[54]. Kim, D. J. et al. Ferroelectric tunnel memristor. *Nano Lett.* 12, 5697-5702 (2012).

[55]. Nakamura, M. et al. Interface band profiles of Mott-insulator/Nb:SrTiO₃ heterojunctions as investigated by optical spectroscopy. *Phys. Rev. B* 82, 201101 (2010).

[56]. Sawa, A., Fujii, T., Kawasaki, M. & Tokura, Y. Hysteretic current-voltage characteristics and resistance switching at a rectifying Ti/Pr₀.₇Ca₀.₃MnO₃ interface. *Appl. Phys. Lett.* 85, 4073-4075 (2004).

[57]. Yang, J. J., Strukov, D. B. & Stewart, D. R. Memristive devices for computing. *Nat. Nanotechnol.* 8, 13-24 (2013).

[58]. Streetman, B. G. & Banerjee, S. K. *Solid State Electronic Devices*. Prentice Hall, 2005.

[59]. Prodromakis, T., Peh, B. P., Papavassiliou, C. & Toumazou, C. A versatile memristor model with nonlinear dopant kinetics. *IEEE Trans. Electron Dev.* 58, 3099-3105 (2011).

[60]. Liu, W. et al. Impact of contact on the operation and performance of back-gated monolayer MoS₂ field-effect-transistors. *ACS Nano* 9, 7904-7912 (2015).

[61]. Dankert, A., Langouche, L., Kamalakar, M. V. & Dash, S. P. High-performance molybdenum disulfide field-effect transistors with spin tunnel contacts. *ACS Nano* 8, 476-482 (2014).

[62]. Lee, S., Tang, A., Aloni, S. & Wong, H. S. P. Statistical study on the Schottky barrier reduction of tunneling contacts to CVD synthesized MoS₂. *Nano Lett.* 16, 276-281 (2016).

[63]. Wang, J. et al. High mobility MoS₂ transistor with low Schottky barrier contact by using atomic thick h-BN as a tunneling layer. *Adv. Mater.* 28, 8302-8308 (2016).

What is claimed is:

1. A memtransistor, comprising:
   a polycrystalline monolayer film formed of an atomically thin material, wherein the polycrystalline monolayer film contains grains defining a plurality of grain boundaries thereof; and
   an electrode array formed on the polycrystalline monolayer film, wherein the electrode array has a plurality of electrodes electrically coupled with the polycrystalline monolayer film such that each pair of electrodes defines a channel in the polycrystalline monolayer film therebetween;
   a photoresist layer formed between the polycrystalline monolayer film and the electrode array; and
   a gate electrode capacitively coupled with the channel.

2. The memtransistor of claim 1, wherein the grains have an average grain size of about 1-10 μm.

3. The memtransistor of claim 1, wherein the memtransistor is configured such that a Schottky barrier localized at each electrode is dynamically tunable so as to cause switching from a high resistance state (HRS) to a low resistance state (LRS) or from the LRS to the HRS in the memtransistor.

4. The memtransistor of claim 3, wherein the memtransistor combines resistive switching with transistor gating to realize nonlinear charge transport with tunability of individual states and switching ratios.

5. The memtransistor of claim 4, wherein a switching mechanism of the memtransistor is characterizable with two memristors at contacts connected by a field-effect transistor.

6. The memtransistor of claim 1, wherein the memtransistor is fabricated in a field-effect geometry with channel lengths (L) and widths (W), each varying from 1 μm to 250 μm.

7. The memtransistor of claim 6, wherein L=1-15 μm, and W=100-150 μm.

8. The memtransistor of claim 1, wherein the atomically thin material comprises MoS₂, MoSe₂, WS₂, or WSe₂.

9. The memtransistor of claim 1, wherein the gate electrode is formed of highly doped silicon (Si), or other conductive materials.

10. The memtransistor of claim 1, wherein each electrode of the electrode array is formed of a same metallic material or different metallic materials.

11. The memtransistor of claim 10, wherein the electrode array is formed of at least one of gold (Au), titanium (Ti), and other conductive materials.

12. The memtransistor of claim 1, being an LRS-HRS memtransistor or an LRS-LRS memtransistor.

13. The memtransistor of claim 1, wherein the plurality of electrodes comprise six or more electrodes having two outer electrodes and four or more inner electrodes located between the two outer electrodes, and wherein conductance between any permutation of two of the four or more inner electrodes is modulated by high-bias pulses applied to the two outer electrodes while the four or more inner electrodes are kept floating.

14. The memtransistor of claim 1, wherein the photoresist layer has a thickness of about 1.5 nm.

15. A circuitry, comprising one or more memtransistors according to claim 1.

16. An electronic device, comprising one or more memtransistors according to claim 1.

17. A memtransistor, comprising:
a polycrystalline monolayer film formed of an atomically thin material, wherein the polycrystalline monolayer film contains grains defining a plurality of grain boundaries thereof;
an electrode array formed on the polycrystalline monolayer film, wherein the electrode array has a plurality of electrodes electrically coupled with the polycrystalline monolayer film such that each pair of electrodes defines a channel in the polycrystalline monolayer film therebetween, wherein the plurality of electrodes comprises more than four heterosynaptic electrodes such that voltage pulses applied between two electrodes in one direction affect conductance of the memtransistor in the orthogonal direction; and
a photoresist layer formed between the polycrystalline monolayer film and the electrode array.

18. The memtransistor of claim 17, wherein the grains have an average grain size of about 1-10 μm.

19. The memtransistor of claim 17, wherein the memtransistor is configured such that a Schottky barrier localized at each electrode is dynamically tunable so as to cause switching from a high resistance state (HRS) to a low resistance state (LRS) or from the LRS to the HRS in the memtransistor.

20. The memtransistor of claim 19, wherein the memtransistor combines resistive switching with transistor gating to realize nonlinear charge transport with tunability of individual states and switching ratios.

21. The memtransistor of claim 20, wherein a switching mechanism of the memtransistor is characterizable with two memristors at contacts connected by a field-effect transistor.

22. The memtransistor of claim 17, wherein the atomically thin material comprises $MoS_2$, $MoSe_2$, $WS_2$, or $WSe_2$.

23. The memtransistor of claim 17, wherein each electrode of the electrode array is formed of a same metallic material or different metallic materials.

24. The memtransistor of claim 23, wherein the electrode array is formed of at least one of gold (Au), titanium (Ti), and other conductive materials.

25. The memtransistor of claim 17, further comprising a gate electrode capacitively coupled with the channel.

26. The memtransistor of claim 25, wherein the gate electrode is formed of highly doped silicon (Si), or other conductive materials.

27. The memtransistor of claim 25, further comprising a dielectric layer formed between the polycrystalline monolayer film and the gate electrode.

28. The memtransistor of claim 27, wherein the dielectric layer is formed of oxidized silicon ($SiO_2$) or dielectrics including alumina, hafnia, or zirconia.

29. The memtransistor of claim 17, being an LRS-HRS memtransistor or an LRS-LRS memtransistor.

30. A circuitry, comprising one or more memtransistors according to claim 17.

31. An electronic device, comprising one or more memtransistors according to claim 17.

* * * * *